(12) United States Patent
Yamazaki

(10) Patent No.: US 6,906,343 B2
(45) Date of Patent: Jun. 14, 2005

(54) SEMICONDUCTOR DISPLAY DEVICE

(75) Inventor: Shunpei Yamazaki, Setagaya (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 10/395,702

(22) Filed: Mar. 25, 2003

(65) Prior Publication Data

US 2003/0218177 A1 Nov. 27, 2003

(30) Foreign Application Priority Data

Mar. 26, 2002 (JP) ........................................ 2002-085938

(51) Int. Cl.$^7$ .............................................. H01L 29/04
(52) U.S. Cl. ........................ 257/59; 257/72; 257/443; 257/466; 349/42; 349/43; 349/138
(58) Field of Search .......................... 257/59, 72, 443, 257/466; 349/42, 43, 138

(56) References Cited

U.S. PATENT DOCUMENTS

| 5,643,826 | A | | 7/1997 | Ohtani et al. |
| 5,828,082 | A | * | 10/1998 | Wu .............................. 257/57 |
| 5,932,893 | A | | 8/1999 | Miyanaga et al. |
| 6,204,520 | B1 | * | 3/2001 | Ha et al. ....................... 257/72 |
| 6,300,175 | B1 | * | 10/2001 | Moon ........................... 438/158 |
| 6,365,933 | B1 | | 4/2002 | Yamazaki et al. |
| 6,475,840 | B1 | | 11/2002 | Miyanaga et al. |
| 6,512,246 | B1 | * | 1/2003 | Tanabe .......................... 257/72 |

FOREIGN PATENT DOCUMENTS

| JP | 06-349735 | 12/1994 |
| JP | 07-130652 | 5/1995 |
| JP | 08-078329 | 3/1996 |
| JP | 10-135468 | 5/1998 |
| JP | 10-135469 | 5/1998 |

OTHER PUBLICATIONS

Geis et al., "Crystalline Silicon on Insulators by Graphoepitaxy," IEEE 1979, pp. 210–212.

Geis et al., "Grapho–epitaxy of Silicon on Fused Silica Using Surface Micropatterns and Laser Crystallization," J. Vac. Sci. Tech., 16(6), Nov./Dec. 1979, pp. 1640–1643.

* cited by examiner

Primary Examiner—Tom Thomas
Assistant Examiner—Matthew E. Warren
(74) Attorney, Agent, or Firm—Eric J. Robinson; Robinson Intellectual Property Law Office, P.C.

(57) ABSTRACT

A method of manufacturing a semiconductor device with the use of a laser crystallization method is provided which can prevent grain boundaries from being formed in a channel forming region of a TFT and which can avoid substantial reduction in TFT mobility, reduction in on current, and increase in off current due to the grain boundaries, and a semiconductor device manufactured by using the manufacturing method is also provided. Stripe shape or rectangular shape unevenness is formed only in a driver circuit. Continuous wave laser light is irradiated to a semiconductor film formed on an insulating film along the stripe unevenness of the insulating film or along a major axis or minor axis of the rectangular unevenness. Although it is most preferable to use the continuous wave laser light at this point, pulse wave laser light may also be used.

45 Claims, 22 Drawing Sheets scanning direction of laser light

SEMICONDUCTOR DISPLAY DEVICE

BACKGROUND OF THE INVENTION

1. Field of the Invention

The present invention relates to a semiconductor display device constituted by using a semiconductor film having a crystalline structure, and more specifically, the invention relates to a semiconductor display device using a crystalline semiconductor film obtained through crystal growth on an insulation surface, and using a field effect transistor, in particular, a thin film transistor. The present invention also relates to a method for manufacturing the semiconductor device.

2. Description of the Related Art

In recent years, a technique of forming a TFT on a substrate has greatly progressed, and its application and development for active matrix semiconductor display devices have been advanced. In particular, since a TFT using a polycrystalline semiconductor film has higher field-effect mobility (also referred to as mobility) than a TFT using a conventional amorphous semiconductor film, it enables high-speed operations. It is therefore possible to control a pixel by a driver circuit formed on the same substrate where the pixel is formed, though the pixel is conventionally controlled by a driver circuit provided outside the substrate.

Incidentally, for substrates used in semiconductor devices, a glass substrate is regarded as being promising in comparison with a single crystal silicon substrate in terms of the cost. A glass substrate is inferior in heat resistance and is easily subjected to thermal deformation. Accordingly, in order to avoid thermal deformation of the glass substrate, in the case where a polysilicon TFT is formed on the glass substrate, the use of laser annealing for crystallization of the semiconductor film is extremely effective.

The laser annealing has characteristics such as remarkable reduction of processing time compared to an annealing method utilizing radiant heating or thermal conductive heating. In addition, a semiconductor film is selectively and locally heated so that a substrate is scarcely thermally damaged.

Note that the term "laser annealing method" herein indicates a technique for re-crystallizing a damaged layer formed in a semiconductor substrate or in a semiconductor film, and a technique for crystallizing a semiconductor film formed on a substrate, for example. This also includes a technique that is applied to planarizing or improvement of a surface quality of the semiconductor substrate or the semiconductor film. Applicable laser oscillation apparatuses are: gas laser oscillation apparatuses represented by an excimer laser; and solid laser oscillation apparatuses represented by a YAG laser. It is known that such a device performs crystallization by heating a surface layer of the semiconductor by irradiation of the laser light in an extremely short period of time of about several tens of nanoseconds to several tens of microseconds.

Laser light is classified into two types: pulse oscillation and continuous oscillation, according to an oscillation method. In the pulse oscillation laser, an output energy is relatively high, so that mass productivity can be increased by setting the size of a beam spot to several $cm^2$ or more. In particular, when the shape of the beam spot is processed using an optical system and made to be a linear shape of 10 cm or more in length, it is possible to efficiently perform irradiation of the laser light to the substrate and further enhance the mass productivity. Thus, for crystallization of the semiconductor film, the use of a pulse oscillation laser is becoming mainstream.

In recent years, however, it has been found that the grain size of crystals formed in a semiconductor film is larger when continuous wave laser is used to crystallize a semiconductor film than when a pulse oscillation laser is used. With crystals of larger grain size in a semiconductor film, the mobility of TFTs formed from this semiconductor film is increased, and the variation in the characteristics of the TFTs caused by grain boundaries is suppressed. As a result, continuous wave laser light is now suddenly attracting attention.

A crystalline semiconductor film manufactured by using a laser annealing method, which is roughly divided into pulse wave and continuous wave types, is generally formed with an aggregation of a plurality of crystal grains. The position and size of the crystal grains are random, and it is difficult to specify the crystal grain position and size when forming a crystalline semiconductor film. Crystal grain interfaces (grain boundaries) therefore exist within an active layer formed by patterning the aforementioned crystalline semiconductor film into an island-like.

Note that the term "grain boundary", which is also called a crystal grain boundary, refers to one of lattice defects categorized as a plane defect. The plane defect includes not only the grain boundary but also a twin plane, a stacking fault, or the like. In this specification, the plane defects having electrical activity and dangling bonds, i.e., the grain boundary and the stacking fault are collectively called the grain boundary.

In contrast with the crystal grains, countless recombination centers and capture centers exist in the grain boundaries due to an amorphous structure, crystal defects, and the like. It is known that a carrier is trapped in the capture centers, the potential of the grain boundaries rises, and the grain boundaries become barriers with respect to the carrier, and therefore the current transporting characteristics for the carrier are reduced. The existence of grain boundaries within the TFT active layer, in particular within a channel forming region, therefore exerts a great influence on the characteristics of the TFT in which a TFT mobility drops considerably, an ON current is reduced, and an OFF current is increased due to electric current flowing in the grain boundaries. Further, the characteristics of a plurality of TFTs, manufactured on the premise that the same characteristics can be obtained, may vary depending on the existence of grain boundaries within the active layers.

The position and size of the crystal grains obtained when irradiating laser light to a semiconductor film become random due to the following reasons. A certain amount of time is required until the generation of solid state nuclei within a liquid semiconductor film which is completely melted by the irradiation of laser light. Countless crystal nuclei are generated in completely melted regions along with the passage of time, and crystal grows from each of the crystal nuclei. The positions at which the crystal nuclei are generated are random, and therefore the crystal nuclei are distributed non-uniformly. Crystal growth stops at points where the crystal nuclei run into each other, and therefore the position and the size of the crystal grains become random.

It is ideal to form the channel forming region, which exerts a great influence on the TFT characteristics, by a single crystal grain, thus eliminating the influence of grain boundaries. However, it is almost impossible to form an amorphous silicon film, in which grain boundaries do not exist, by using a laser annealing method. It has therefore not been possible to date to obtain characteristics equivalent to those of a MOS transistor, which is manufactured on a single crystal silicon substrate, in a TFT that uses a crystalline silicon film crystallized by employing laser annealing.

SUMMARY OF THE INVENTION

In view of the aforementioned problems, an object of the invention is to provide a method of manufacturing a semiconductor device, and a semiconductor device manufactured by using the manufacturing method, in which a laser crystallization method is used that is capable of preventing the formation of grain boundaries in TFT channel forming regions, and is capable of preventing conspicuous drops in TFT mobility, reduction in the ON current, and increases in the OFF current, all due to grain boundaries.

The applicants of the present invention discovered that if a semiconductor film is formed on an insulating film having unevenness, and laser light is irradiated to the semiconductor film, then grain boundaries are selectively formed on portions, which are located on projective portions of the insulating film, of the crystallized semiconductor film.

FIG. 16 shows a TEM image of a test piece, seen from above, when continuous wave laser light having an output energy of 5.5 W is irradiated to a 150 nm thick amorphous semiconductor film, which is formed on a base film having unevenness, along a longitudinal direction of the projective portions with a scanning speed of 50 cm/sec. Further, the TEM image shown in FIG. 16 is shown schematically in FIG. 17 for easier explanation thereof to be understood.

The width of a projective portion 8001 is 0.5 $\mu$m, the width of a depressive portion is 0.5 $\mu$m, and the thickness of the projective portion is 250 nm. Among semiconductor films in FIG. 16 and FIG. 17, a region denoted by the reference numeral 8001 corresponds to a portion located on an upper portion of the projective portion, and a region denoted by reference numeral 8002 corresponds to a portion located on an upper portion of the depressive portion. Note that the term depressive portion indicates a depressed region on which the projective portion is not formed. As shown in FIG. 17, a grain boundary 8003 is formed in the semiconductor film in the upper portion of the projective portion 8001.

FIG. 18 shows a TEM image, in its cross section in a direction orthogonal to a laser light scanning direction, of a test piece, which is manufactured under the same conditions as those for the test piece shown in FIG. 16 and then undergoes Secco etching. A base film having unevenness is formed of a three layer insulating film. A second insulating film made from silicon oxide having a stripe shape is formed on a first insulating film made of silicon nitride, and a third insulating film made of silicon oxide is formed covering the first insulating film and the second insulating film.

Note that Secco etching is performed at room temperature for 75 seconds using an aqueous solution mixed with $K_2Cr_2O_7$ and HF.

A grain boundary 8005 on a projective portion 8009 is expanded by Secco etching, and its position becomes clearer, as shown in FIG. 18. Note that a white portion visible within the projective portion 8009 shows that silicon oxide is etched through the grain boundary due to the semiconductor film grain boundary which is expanded by Secco etching.

Further, FIG. 21 shows a TEM image, which is seen from above, of a test piece which is manufactured by the same conditions as those for the test pieces shown in FIG. 16 and FIG. 18 and undergoes Secco etching. The Secco etching conditions are the same as those of FIG. 18. A region denoted by reference numeral 8501 corresponds to a portion located in an upper portion of a projective portion, and a region denoted by reference numeral 8502 corresponds to a portion located in an upper portion of a depressive portion. A white portion visible in the portion located in the upper portion of the projective portion 8501 shows a portion in which a grain boundary of the semiconductor film is etched and expanded by Secco etching, and it becomes clear that the grain boundary is selectively formed on the upper portion of the projective portion 8501.

Further, a surface of a semiconductor film 8006 is leveled by the laser light irradiation in the photograph shown in FIG. 18. From this fact, the applicants of the present invention consider that one of the causes of the grain boundary developing on the projective portion is that: volumetric movement of the semiconductor film, which is located on the upper portion of the insulating film, toward the direction of a bottom portion of the depressive portion occurs due to the semiconductor film temporarily melting through the laser light irradiation; and therefore the semiconductor film located on the projective portion becomes thinner and unable to withstand stress.

Further, simulation results for temporal changes in a temperature distribution in a semiconductor film formed on an insulating film having unevenness during laser light irradiation to the semiconductor film are shown in FIGS. 19A to 19F. Unevenness on a lower side of the graphs expresses a base film 8008 formed of an oxide film. Further, an upper side line 8009 is a boundary between silicon and an air layer, and shows a portion to which laser light is irradiated. The oxide film thickness and the silicon film thickness are each 200 nm, and the unevenness spacing is 1 $\mu$m. The laser light irradiation conditions were, with Gaussian, a peak energy density of 45,000 W/cm² and $\sigma=7\times10^{-5}$ sec.

FIG. 19A shows a temperature distribution immediately after laser light irradiation, and FIGS. 19B to 19F show temperature distributions at 2.5 $\mu$sec intervals thereafter.

Regions shown by dark colors are portions that can be considered to have the highest temperature, and it can be seen that the dark colored portions become fewer as the state shifts from FIG. 19A to FIG. 19F. Regarding the temperature of the silicon 8009, it can be seen that, as time passes, portions on depressive portions of the base film 8008 have temperature reduction before portions on projective portions of the base film 8008.

FIG. 20 shows simulation results for temporal changes in temperature due to location of a semiconductor film in irradiating laser light to the semiconductor film formed on an insulating film having unevenness.

A graph shown in FIG. 20 shows a semiconductor film temperature (K) on its vertical axis, and time (second) on its horizontal axis. A solid line shows the temperature of the semiconductor film located on a projective portion, and a dashed line shows the temperature of the semiconductor film located on a depressive portion. Temperature reduction temporarily stops along with a phase transformation at 1600 K, but after the phase transformation, the semiconductor film on the depressive portion which is shown by the dashed line begins dropping in temperature ahead of the semiconductor film on the projective portion, and it can be understood that the semiconductor film on the depressive portion undergoes earlier phase transformation.

It is considered that efficient heat radiation occurs in portions that have a larger surface area in contact with the insulating film when heat within the semiconductor film is radiated to the insulating film after the semiconductor film melts due to the irradiation of laser light. Portions at which surfaces in contact intersect therefore perform heat radiation more efficiently than portions at which the contact surface between the semiconductor film and the insulating film is flat. Further, heat radiation is performed efficiently in portions where the heat capacity of the insulating film is large. For example, the vicinity of the depressive portion has a larger heat capacity than the vicinity of the projective portion because it has a larger volume of the insulating film within a fixed range. Therefore, it is difficult for escaped heat to remain, and heat radiation is performed efficiently. Consequently, crystal seeds tend to develop earlier in the vicinity of the depressive portion than the vicinity of the projective portion.

Crystal growth proceeds as time passes, from the crystal seeds generated in the vicinity of the depressive portion toward the projective portion. One cause of grain boundaries developing on the projective portion can be considered to be the fact that crystal growths advancing from adjacent depressive portions come together on the projective portion between the two depressive portions.

Whatever the cause, the grain boundaries are selectively formed in upper portions of the projective portions while the grain boundaries tend not to be formed in portions located in the depressive portions on the semiconductor films thus crystallized.

From the semiconductor film crystallized by laser light, the applicants of the present invention considered using the portions formed on the depressive portions and having relatively few grain boundaries, as TFT active layers.

Continuous wave laser light is most preferably used as the laser light, but pulse wave laser light may also be used. Note that it is preferable for a cross section of the projective portion in a direction orthogonal to the laser light scanning direction to be a quadrilateral shape, including a rectangular shape, or a triangular shape.

In accordance with the aforementioned structure, it can be made relatively difficult for grain boundaries to be formed in the semiconductor films located on the depressive portions of the insulating film when performing crystallization through laser light irradiation. Note that, although the semiconductor films located on the depressive portions of the insulating films have superior crystallinity, they do not always contain zero grain boundaries. However, it can be said that, even if grain boundaries do exist, crystal grains are larger, and the crystallinity is relatively superior, compared to the semiconductor films located on the projective portions of the insulating film. The locations at which grain boundaries are formed in the semiconductor films can therefore be predicted to a certain extent at the insulating film shape design stage. That is, the locations at which grain boundaries are formed can be set selectively with the present invention, and therefore it becomes possible to lay out the active layer such that, as much as possible, grain boundaries are not contained in the active layer, more preferably in channel forming regions.

The formation of grain boundaries in the TFT channel forming region can be avoided with the present invention by actively using the island shape semiconductor films located on the depressive portions of the base film as the TFT active layers. Substantial reduction in TFT mobility, reduction in on current, and increase in off current due to the grain boundaries can be avoided. Note that designers can suitably determine just how much material is removed by patterning in the vicinity of projective portion or depressive portion edges.

In particular, TFTs having the aforementioned structure are used not in the pixel portion for displaying an image in a semiconductor display device, but rather in the driver circuit for supplying a video signal and other signals to the pixel portion. It is necessary to drive the driver circuit at a higher frequency than that for the pixel portion, and therefore it is extremely effective to use the above-structured TFT of the present invention. Further, an on current having a desired value can be obtained with the increase in crystallinity of the active layer, even if the size of the active layer is suppressed. The surface area of the entire driver circuit can therefore be held down. As a result, the ratio of the driver circuit to the overall semiconductor display device can be held down.

Further, in the present invention, the stripe shape semiconductor film is formed on the flat base film in the pixel portion, without forming the above-structured projective portions. Transmittivity varies in the pixel portion by the layout of island shape semiconductor films that function as the TFT active layers and capacitance electrodes. As to layout of the island shape semiconductor films, design restrictions for the pixel portion are therefore largely more complicated than those for the driver circuit, and it is difficult to lay out the island shape semiconductor films between the projective portions disposed in parallel. In addition, the pixel portion does not require high-speed operation compared to the driver circuit, and therefore it does not become much of a problem even if the TFTs are not used in which the above-structured island shape semiconductor films are used as their active layers. On the contrary, this reduces design restrictions on the layout of the island shape semiconductor film, and is therefore preferable.

Note that the energy density generally is low in the vicinity of edges of a laser beam of laser light compared to the vicinity of the center, and there are many cases in which semiconductor film crystallinity is degraded. It is therefore preferable to make certain that portions that later become TFT channel forming regions do not overlap with trajectory edges when scanning the laser light. Further, it is necessary to irradiate laser light having a fixed energy density to, at minimum, portions that become channel forming regions, and more preferably to the entire flat surfaces of the depressive portions. In the present invention, it is therefore necessary to use a laser beam having an energy density distribution such that regions having a uniform energy density overlap with, at minimum, portions that become channel forming regions, and more preferably overlap completely with the entire flat surfaces of the depressive portions when scanning the laser light. Making the shape of the laser beam into a rectangular shape, a linear shape, or the like can be considered preferable in order to satisfy the aforementioned energy density conditions.

In addition, portions of the laser beam which have a low energy density may also be blocked through a slit. Laser light having a relatively uniform energy density can be irradiated to the entire flat surfaces of the depressive portions, or to the entire flat surfaces of the projective portions, by using the slit, and crystallization can be performed uniformly. Further, the width of the laser beam can be partially changed in accordance with insulating film or semiconductor film pattern information by forming the slit, and in addition, restrictions on the layout of channel forming regions, and of TFT active layers can be reduced. Note that the term laser beam width refers to the length of the laser beam in a direction orthogonal to the scanning direction.

Further, one laser beam obtained by synthesizing laser light emitted from a plurality of laser oscillation devices may also be used in laser crystallization. Portions having weak energy density in each of the laser lights can be mutually compensated for by using the above structure.

Further, the semiconductor film may also be crystallized by performing the irradiation of laser light without exposure to the atmosphere (for example, by using a specific gas atmosphere such as an inert gas, nitrogen, or oxygen, or a reduced pressure atmosphere) after film formation of the semiconductor film. Contaminants at the molecular level within a clean room, for example, boron contained within a filter used for increasing the cleanliness of air can be prevented from contaminating the semiconductor film when performing crystallization with laser light under the aforementioned structure.

DETAILED DESCRIPTION OF THE PREFERRED EMBODIMENTS

Hereinafter, a manufacturing method for a semiconductor device of the present invention will be described.

Figure 1A:
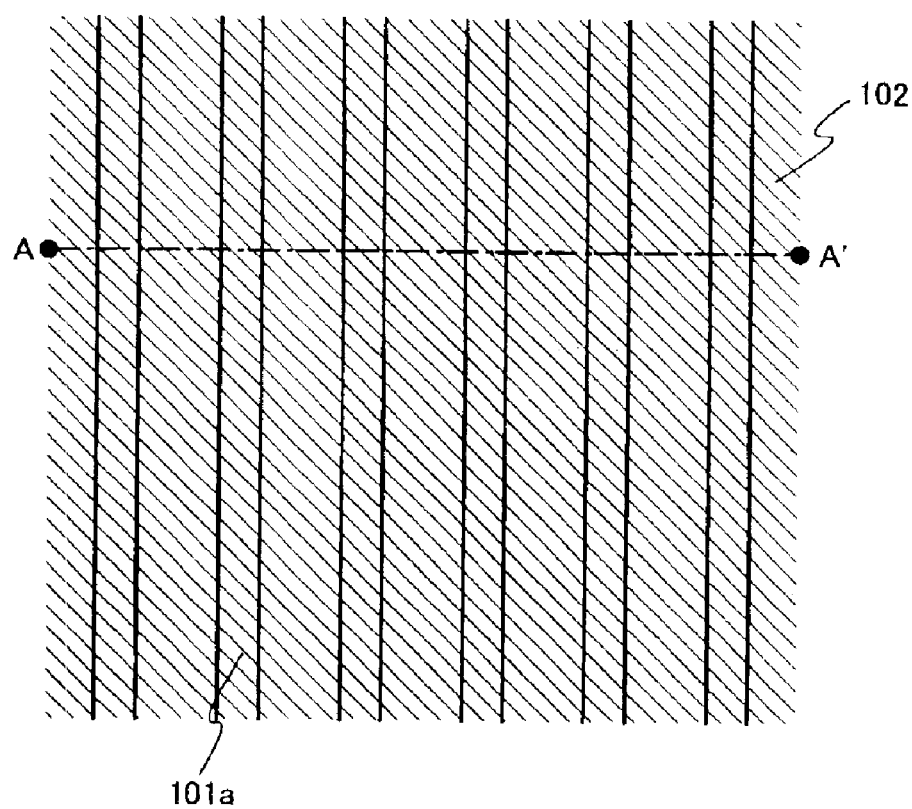
FIGS. 1A and 1B are diagrams showing processes for manufacturing a semiconductor display device of the present invention.
Figure 1B:
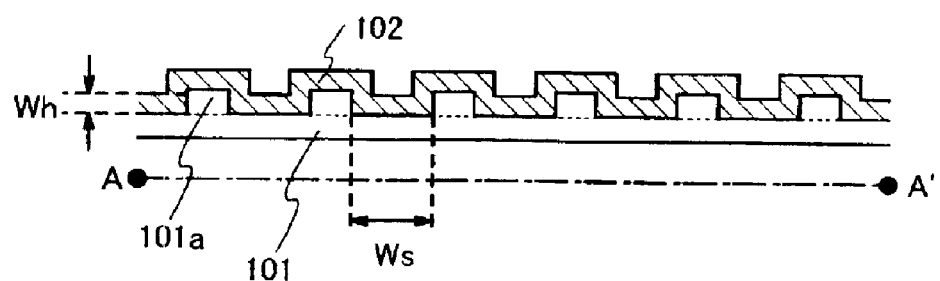

First, as shown in FIG. 1A, a base film 101 having projective portions 101a of a rectangular or stripe shape is formed on a substrate. FIG. 1B is a sectional view taken along the line A–A' of FIG. 1A.

The substrate (not shown) may be made of any material as long as it has heat resistance to a processing temperature in subsequent steps. For example, a quartz substrate, a silicon substrate, a glass substrate such as barium borosilicate grass or aluminoborosilicate glass, a metal substrate, or a substrate obtained by forming an insulating film on a surface of a stainless steel substrate can be used. Also, a plastic substrate having heat resistance high enough for the substrate to withstand the processing temperature may be used.

In this embodiment mode, a silicon oxide film is used as the base film 101. Note that a material for the base film 101 is not limited to this but may be any material as long as it can withstand heat treatment in subsequent steps as well as prevent alkaline metal affecting characteristics of TFTs from mixing into a semiconductor film formed later. Then, the base film may be formed of an insulating film on which unevennesses can be formed. Note that a detailed description will be made of how the unevennesses are formed at the subsequent stage. Also, the base film may be formed of an insulating film other than the films described above and of an insulating film having not a single layer structure but a laminate structure obtained by laminating two or more insulating films.

Next, a semiconductor film 102 is formed so as to cover the insulating film 101. The semiconductor film 102 may be formed by a known method (sputtering method, LPCVD method, plasma CVC method, or the like). Here, the semiconductor film may be an amorphous semiconductor film, a microcrystalline semiconductor film, or a crystalline semiconductor film. Also, not only silicon but also silicon germanium may be used. When the silicon germanium is used, the concentration of the germanium is preferred to be kept at a range from 0.01 to 4.5 atomic %. Further, after the base film 101 is formed, the semiconductor film is continuously formed without being exposed to the atmosphere, which can prevent the impurities from mixing between the semiconductor film and the base film.

Further, if the width between the projective portions is excessively small or large, the effects of the present invention cannot be obtained. Also, the height of the projective portion is excessively large, which increases the possibility that the semiconductor film formed later may be cut off in the vicinity of edge portions of the projective portions. Also, the excessively low projective portion cannot realize the effects of the present invention. The designer can set the sectional shape and the size of the projective portion 101a as appropriate while taking into account the balance with the semiconductor film thickness. A width Ws between the projective portions is preferably set to 0.01 to 2 µm, more preferably, about 0.1 to 1 µm. Also, a height Wh of the projective portion is preferably set to 0.01 to 3 µm, more preferably, about 0.1 to 2 µm. Alternatively, the height of the projective portion is made small and the height Wh may be set to 0.01 to 1 µm, more preferably, about 0.05 to 0.2 µm.

Figure 2A:
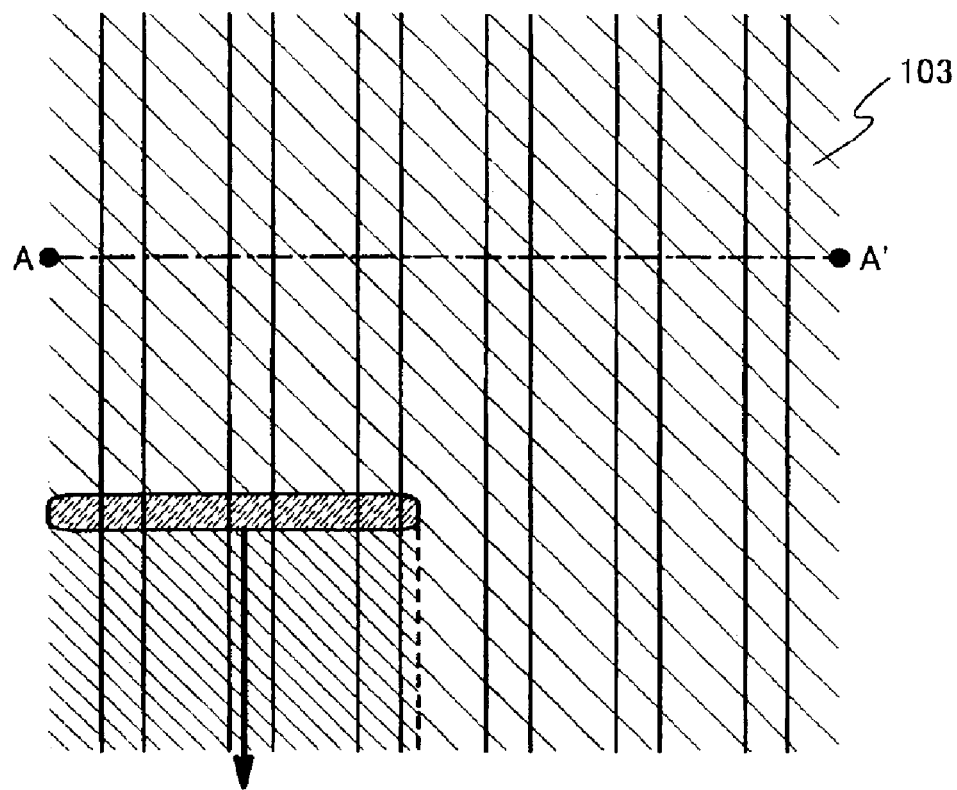
FIGS. 2A and 2B are diagrams showing processes for manufacturing a semiconductor display device of the present invention.
Figure 2B:
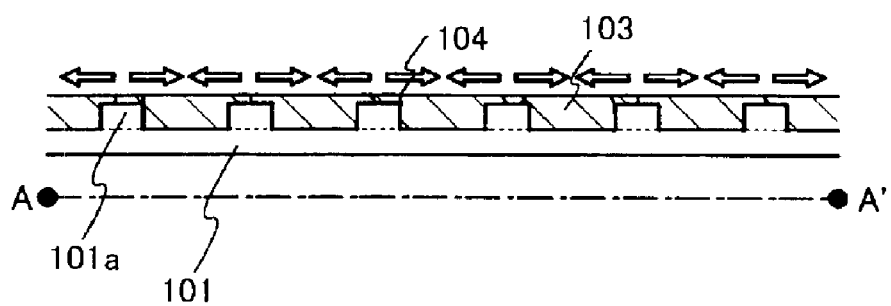

Next, as shown in FIG. 2A, laser light is irradiated onto the semiconductor film 102. Note that FIG. 2B is a sectional view taken along the dashed line A–A' of FIG. 2A.

In this embodiment mode, as indicated by arrows in FIG. 2A, the laser light irradiation is performed with the scanning direction aligned with a longitudinal direction of the rectangular projective portion 101a. In addition, the present invention is not limited to this structure. It is possible for a designer to set the scanning direction appropriately. Through the laser light irradiation, the semiconductor film 102 is temporarily melted and the volume thereof is moved from a portion on the projective portion to the depressive portion as indicated by outline arrows in FIG. 2B. Then, a semiconductor film 103 having the leveled surface and the increased crystallinity is formed. An energy density of the laser light becomes low in the vicinity of edges of the laser beam. Thus, the grain size is small in the vicinity of the edges and protruded portions (ridges) appear along the grain boundary of the crystal. Therefore, the laser light irradiation is performed such that the edges of laser beam trajectory of the laser light is not overlapped with a portion serving as the channel forming region or that positioned above the depressive portion of the semiconductor film 102.

In the present invention, well-known lasers may be used. Although it is preferable that the laser light is continuous wave laser light, it is conceivable that the effects of the present invention will be achieved to some extent with a pulse wave also. For the laser, a gas laser and a solid laser may be used. Examples of gas lasers include an excimer laser, an Ar laser, and a Kr laser, while examples of solid lasers include a YAG laser, an YVO$_4$ laser, an YLF laser, a YAlO$_3$ laser, a glass laser, a ruby laser, an alexandrite laser, a Ti:sapphire laser, and an Y$_2$O$_3$ laser. The applicable solid laser is one that uses a crystal such as YAG, YVO$_4$, YLF, or YAlO$_3$ doped with Cr, Nd, Er, Ho, Ce, Co, Ti, Yb, or Tm. The fundamental wave of the laser varies depending on the material used in doping, but laser light having the fundamental wave of around 1 µm us obtained. The harmonic with respect to the fundamental wave may be obtained by using a non-linear optical element.

Furthermore, an infrared laser light emitted from a solid laser is converted into a green laser light by a nonlinear optical element and thereafter, an ultraviolet laser light obtained through another nonlinear optical element can be also used.

The semiconductor film 103 moves its volume due to the laser light irradiation. Thus, the thickness thereof is made large in the portion above the depressive portion, whereas it is made small in the portion above the projective portion 101a. As a result, the grain boundary 104 is easily generated above the projective portion due to the stress. In contrast, the semiconductor film achieves a state with satisfactory crystallinity above the depressive portion. Note that this does not mean that the semiconductor film 103 has always no grain boundaries above the depressive portion. However, even if the grain boundary exists, the grain size is large and thus, the relatively superior crystallinity is obtained.

Note that, upon the crystallization of the semiconductor film, the steps of irradiating the laser light and crystallizing the semiconductor film using a catalyst can be combined. In the case of using a catalytic element, the techniques disclosed in JP 07-130652 A and JP 08-78329 A can be used.

Figure 3A:
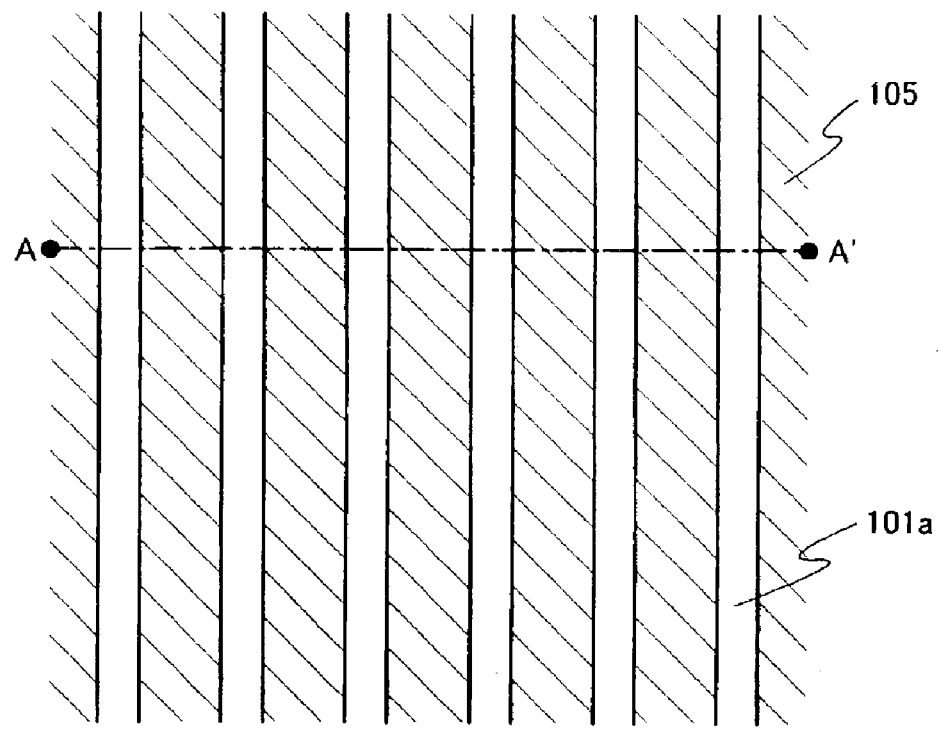
FIGS. 3A and 3B are diagrams showing processes for manufacturing a semiconductor display device of the present invention.
Figure 3B:
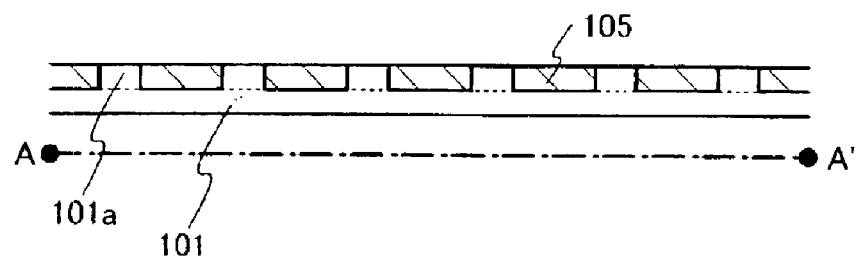

Next, as shown in FIG. 3A, the surface of the semiconductor film 103 is being etched to expose the upper surface of the projective portion 101a of the base film 101. Note that FIG. 3B is a sectional view taken along the dashed line A–A' of FIG. 3A. Through the above steps, the semiconductor film 105 existing in the projective portion of the base film 101 is formed. The removal of the semiconductor film 103 from the upper surface can be conducted using any method, e.g., an etching method or a CMP method.

Through this removal from the upper surface, the portion on the projective portion 101a in which the grain boundary exists is removed and the semiconductor film having a satisfactory crystallinity and serving as the channel forming region later remains on the depressive portion between the projective portions 101a.

Figure 4A:
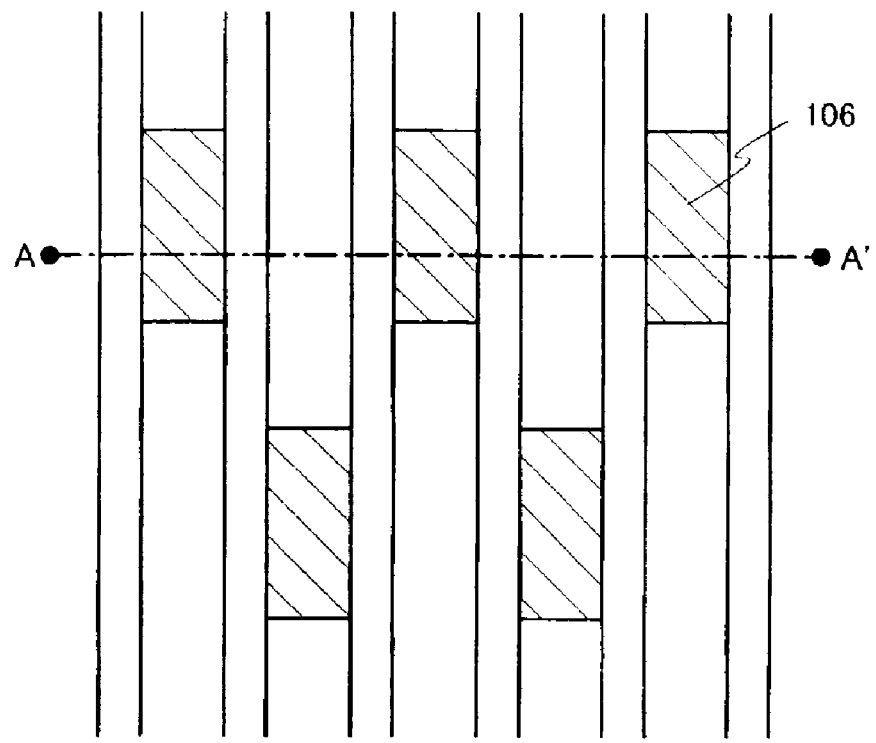
FIGS. 4A and 4B are diagrams showing processes for manufacturing a semiconductor display device of the present invention.
Figure 4B:
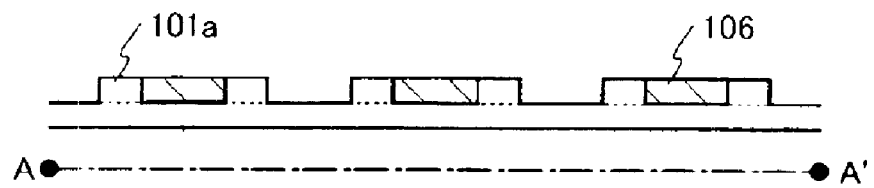

Next, as shown in FIG. 4A, the semiconductor film 105 is patterned to form an island-like semiconductor film 106 as an active layer. Note that FIG. 4B is a sectional view taken along the dashed line A–A' of FIG. 4A. The island-like semiconductor film 106 partially exists on the depressive portion formed between the projective portions 101a. Further, the semiconductor film 106 is partially brought into contact with the projective portion 101a. It is desirable to determine the layout of the projective portions 101a considering the channel length and width of the channel forming region of the TFT so that it is formed using the portion located above the depressive portion of the semiconductor film 105. Note that portions serving as source/drain regions are also formed using the semiconductor film located above the depressive portion and thus, resistance thereof can be reduced.

Note that in FIGS. 4A and 4B, although each island shape semiconductor film 106 is not overlapped with the projective portion 101a, the present invention is not limited to this structure. The island shape semiconductor films 106 may be partially overlapped with the projective portions 101a. Further, a so-called multi-channel type TFT can be also adopted which includes the plural channel forming regions separated from one another, and the source regions and the drain regions with the plural channel forming regions being all interposed therebetween. Further, in this TFT, all of the plural channel forming regions are not overlapped with the projective portions 101a and the source regions and the drain regions are partially overlapped with the projective portions.

Figure 12A:
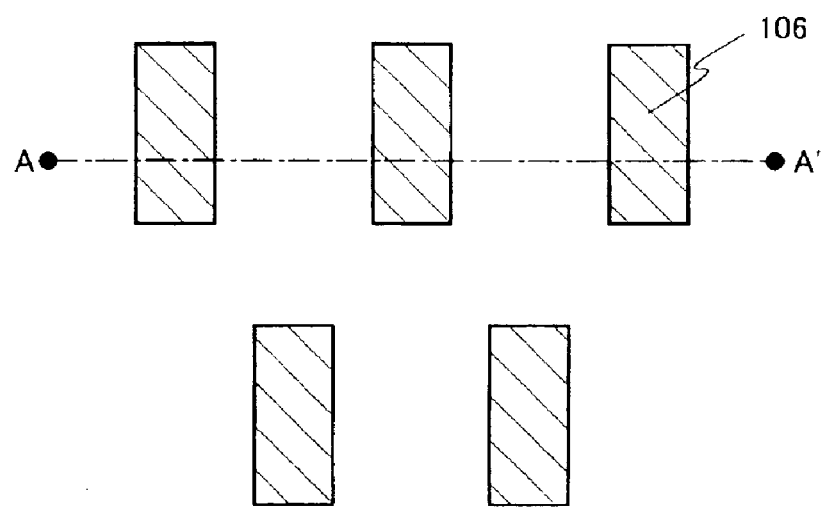
FIGS. 12A and 12B are diagrams showing processes for manufacturing a TFT of the present invention.
Figure 12B:
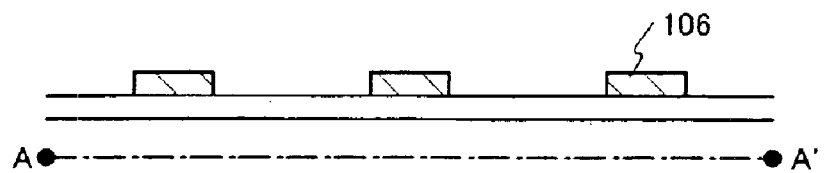

Further, in FIG. 4, although the projective portion 101a is remained, but may be removed after the formation of the island shape semiconductor film 106. FIG. 12A shows a state of the island shape semiconductor film 106 after removing the projective portion 101a. Further, FIG. 12B is a sectional view taken along the dashed line A–A' of FIG. 12A.

The island-like semiconductor film obtained through a series of steps described above is used as an active layer to form the TFT. There are given various manufacturing steps and specific structures of the TFT having the plural channel forming regions separated from each other. As a typical example thereof, a step of adding an impurity to the island-like semiconductor film to form the source region and the drain region, a step of forming a gate insulating film, and a step of forming a gate electrode are performed.

Note that, in this embodiment mode, subsequent to the step of removing the surface of the semiconductor film crystallized by the laser light irradiation to such a degree as to expose the projective portion, the step of forming the island-like semiconductor film by patterning is performed. However, the present invention is not limited to this structure. Subsequent to the step of forming the island-like semiconductor film by patterning, the step of removing the surface of the island-like semiconductor film to such a degree as to expose the projective portion may be performed. Further, the step of crystallizing the semiconductor film by the laser light may be performed after the step of patterning the semiconductor film.

In the present invention, the semiconductor film located above the depressive portion of the insulating film is actively used as an active layer of the TFT, which makes it possible to prevent the formation of the grain boundary in the channel forming region of the TFT as well as the remarkable reduction in the mobility of the TFT, the decrease in an ON current, and the increase in an OFF current due to the grain boundary. Further, the variation in the characteristics of the TFT can be suppressed.

Figure 5A:
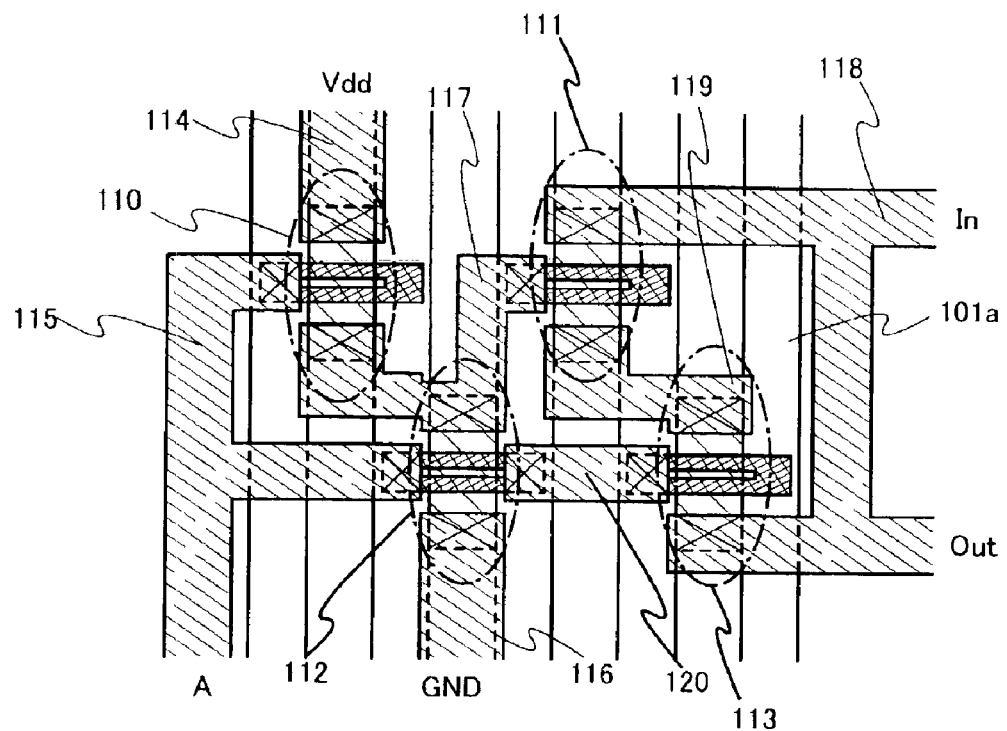
FIGS. 5A and 5B are an upper surface diagram and a circuit diagram, respectively, of an inverter and a transmission gate formed by using a manufacturing method of the present invention.
Figure 5B:
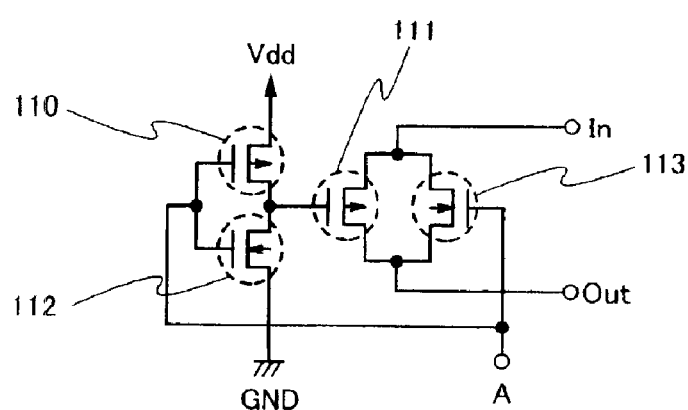

Then, after manufacturing the TFT, wirings for electrically connecting among the gate electrodes, the source regions, and the drain regions of the TFTs are formed in accordance with the specification of the target circuit. FIGS. 5A and 5B illustrate a case of forming an inverter and a transmission gate using the TFTs.

FIG. 5A is a top view of the inverter and the transmission gate formed according to the manufacturing method of the present invention and FIG. 5B is a circuit diagram thereof. By using the island-like semiconductor film obtained through a series of steps in the manufacturing method described above, p-channel TFTs 110 and 111 and n-channel TFTs 112 and 113 are formed. These TFTs 110 to 113 each include at least an active layer, a gate insulating film, and a gate electrode. In each active layer, at least a channel forming region, and a source region and a drain region sandwiching the channel forming region are provided.

Note that, an LDD region or an offset region may be formed between an impurity region serving as the source/drain region and the channel forming region.

Each TFT has the active layer above the depressive portion and each active layer locates between the projective portions 101a and is not overlapped with the projective portions 101a. Wirings 115 to 120 are used to connect among the source regions, the drain regions, and the gate electrodes of the TFTs, thereby forming a circuit as shown in the circuit diagram of FIG. 5B. Specifically, the p-channel TFT 110 and the n-channel TFT 112 constitute the inverter. Also, the p-channel TFT 111 and the n-channel TFT 113 constitute the transmission gate. In synchronism with a signal inputted to a terminal A, a signal inputted from a terminal In undergoes sampling to be outputted from a terminal Out.

With the above structure, when the circuit specification is changed, it is only required to change the layout of the wirings for connecting the previously prepared TFTs or logic elements. In the case of FIGS. 5A and 5B, for example, at least two masks including a mask for patterning the wirings and a mask for contact holes of the wirings may be changed. Thus, the cost involved in the design change of the circuit can be suppressed and the circuits of the various specifications can be manufactured.

Note that it is needless to say that the present invention is not limited to the above circuit. Also, in FIG. 5A, the wirings 115 to 120 are formed in the same layer, but the present invention is not limited to this. The wirings for connecting the TFTs may be formed in the different layers. By forming the wirings in the different layers, complicated connections become possible and a variety of circuits can be achieved using the same number of TFTs as in the above case. Note that the TFTs may be connected through the wirings (plugs) formed by damascene processes etc.

Further, in the above steps, after the semiconductor film subjected to the laser light irradiation or crystallization is etched to such a degree as to expose the projective portion of the base film, it is heated at 500 to 600° C. for about 1 to 60 minutes, so that the stress developed in the semiconductor film can be relaxed.

The manufacturing method of the present invention is used to enable the formation, for example, of a CPU using an LSI, and a memory element (e.g., SRAM), a counter circuit, a division circuit logic, etc. of various logic circuits. The present invention is applicable to the various semiconductor devices.

Figure 6A:
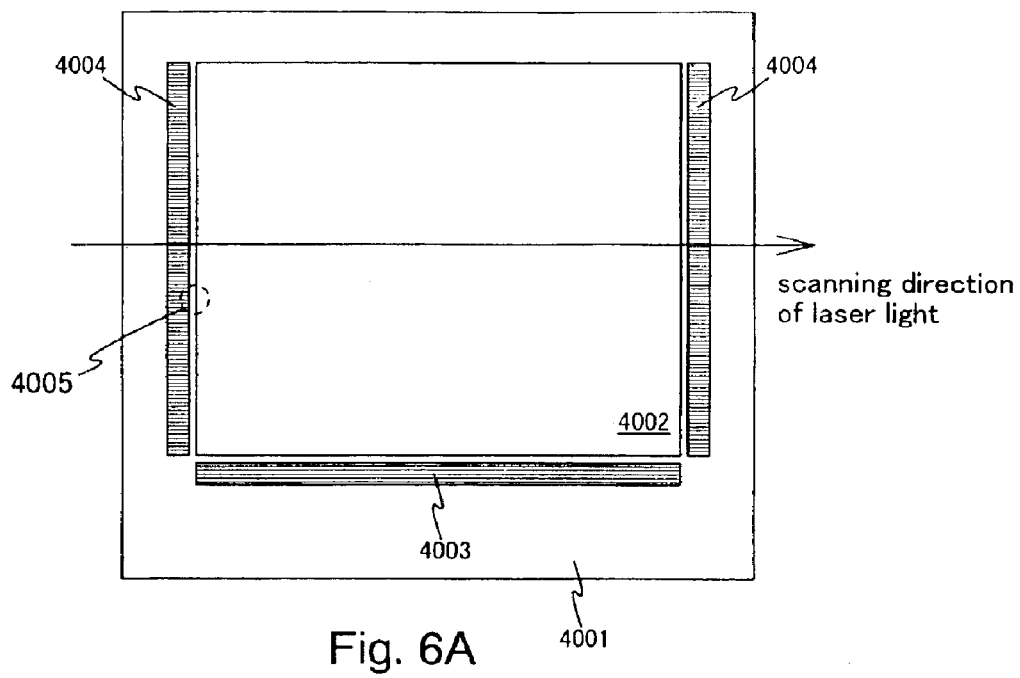
FIGS. 6A and 6B are an upper surface diagram of an element substrate of a semiconductor display device of the present invention, and an enlarged diagram of a pixel portion and a scanning line driver circuit, respectively.

The structure of the semiconductor display device of the present invention having the aforementioned structure is explained next. FIG. 6A is an upper surface diagram of a substrate of a general semiconductor display device. In FIG. 6A, a pixel portion 4002 and driver circuits 4003 and 4004 for supplying video signals, other signals, or electric power to the pixel portion are provided on a substrate 4001. Note that the state at a point where island shape semiconductor films are formed is shown in FIG. 6A.

The driver circuit 4004 is a scanning line driver circuit, and is a circuit for selecting in order a plurality of pixels formed in the pixel portion 4002. The driver circuit 4003 is a signal line driver circuit, and is a circuit for inputting a video signal at a predetermined timing into the pixel selected by the scanning line driver circuit 4004. Note that FIG. 6 shows a typical structure for the semiconductor display device substrate, and the semiconductor display device of the present invention is not limited to this structure.

According to the present invention, in the driver circuits 4003 and 4004, the island shape semiconductor films crystallized by laser light are formed on an insulating film having projective portions like those shown in FIGS. 1A and 1B. On the other hand, the island shape semiconductor films formed in the pixel portion 4002 are formed on a flat insulating film.

Figure 6B:
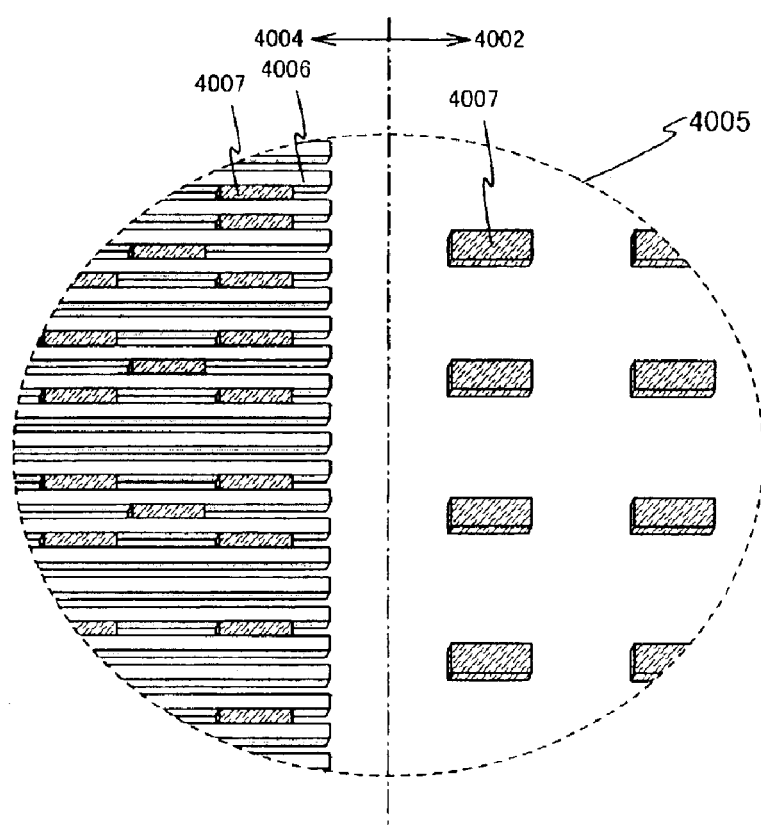

An enlarged diagram of a region 4005 that contains a portion of the signal line driver circuit 4003 and the pixel portion 4002 of FIG. 6A is shown in FIG. 6B. The signal line driver circuit 4003 has a plurality of stripe shape or rectangular shape projective portions 4006, and has island shape semiconductor films 4007 between the projective portions 4006. The island shape semiconductor films 4007 are formed by using the manufacturing method shown in FIGS. 1A and 1B.

Although not shown in the figures, a plurality of stripe shape or rectangular shape projective portions may be similarly formed in the scanning line driver circuit 4004, and island shape semiconductor films may be formed between the projective portions. However, it is more preferable to have all of the projective portions, which are formed on the substrate, lined up in the longitudinal direction in order to suppress dispersions in TFT characteristics.

It is necessary to drive the driver circuit at a higher frequency than that for the pixel portion, and therefore it is extremely effective to use the TFT in which the island-shape semiconductor film is used as an active layer of the present invention. Further, an on current having a desired value can be obtained with the increase in crystallinity of the active layer, even if the size of the active layer is suppressed. The surface area of the entire driver circuit can therefore be held down. As a result, the ratio of the driver circuit to the overall semiconductor display device can be held down.

Further, in the present invention, the island shape semiconductor films are formed on a flat base film without daring to form the projective portions having the aforementioned structure in the pixel portion. Transmittivity varies in the pixel portion depending on the layout of the island shape semiconductor films that function as TFT active layers or capacitance electrodes. As to layout of the island shape semiconductor films, design restrictions for the pixel portion are therefore largely more complicated than those for the driver circuit, and it is difficult to lay out the island shape semiconductor films between the projective portions disposed in parallel. In addition, the pixel portion does not require high-speed operation compared to the driver circuits, and therefore it does not become much of a problem even if the TFTs are not used in which the above-structured island shape semiconductor films are used as their active layers. On the contrary, this is preferable because design restrictions on the layout of the island shape semiconductor films are reduced.

Note that, although an example of the island shape semiconductor films only existing between the projective portions is shown in the embodiment mode, the present invention is not limited to this structure. A portion of the island shape semiconductor films may also be formed overlapping the projective portions, and the island shape semiconductor films may also be partially in contact with or not in contact with the projective portions. Further, the base film projective portions only may be removed after forming the island shape semiconductor films.

Further, crystallization may be performed so as to increase crystallinity by using laser light only in the driver circuits after the semiconductor films formed in the driver circuits and the pixel portion are crystallized by employing a thermal crystallization method that uses an electric furnace or a lamp annealing crystallization method that uses infrared light.

Alternatively, after the semiconductor films formed in the driver circuits and the pixel portion are subjected to crystallization through laser light irradiation with low energy at a level such that the films are not completely melted in the thickness direction, the semiconductor films only in the driver circuit may be subjected to laser light irradiation with high energy at a level such that the films are completely melted in the thickness direction. Or, after being subjected to crystallization through laser light irradiation with low energy at a level such that the films are not completely melted in the thickness direction, the semiconductor films formed only in the driver circuit may be subjected to laser light irradiation with high energy at a level such that the films are completely melted in the thickness direction.

EMBODIMENTS

Embodiments of the present invention are explained below.

Embodiment 1

In this embodiment, a description will be given of a case in which the projective portion is partially removed after the formation of the island shape semiconductor film in the above embodiment mode.

Figure 7A:
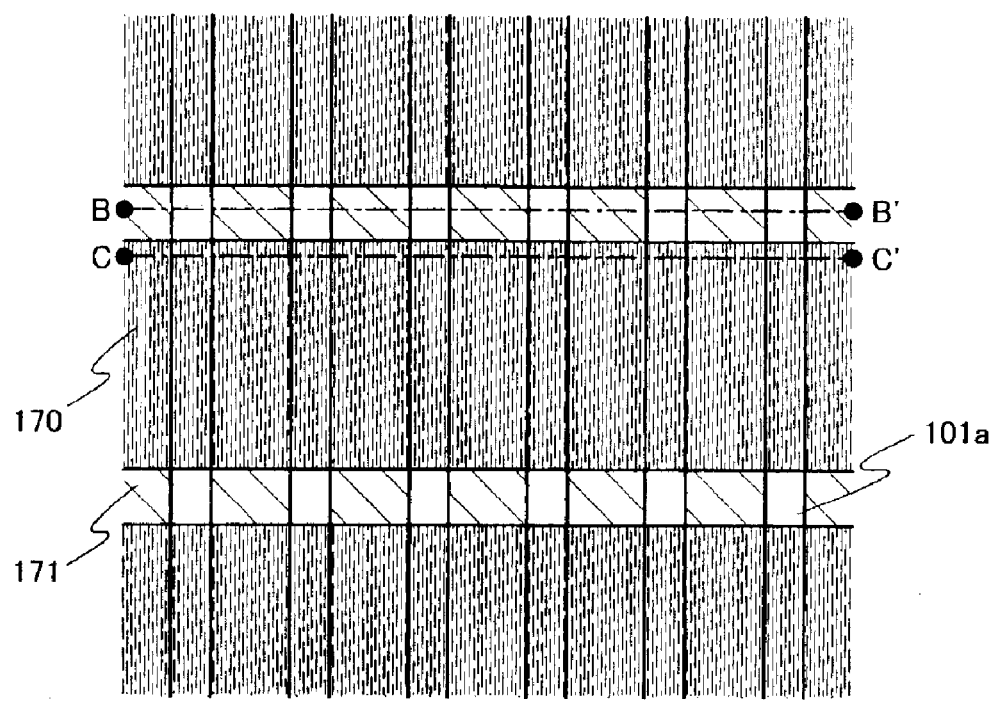
FIGS. 7A to 7C are diagrams showing processes for manufacturing a TFT of the present invention.
Figure 7B:
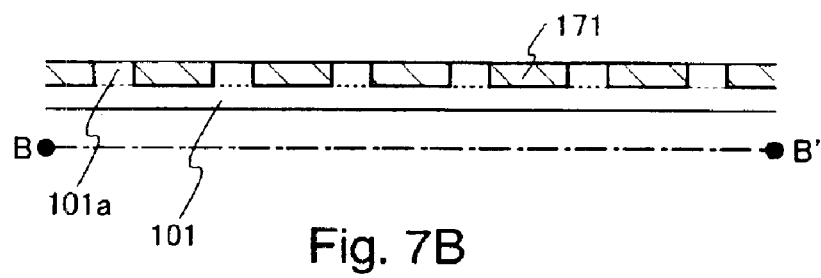
Figure 7C:
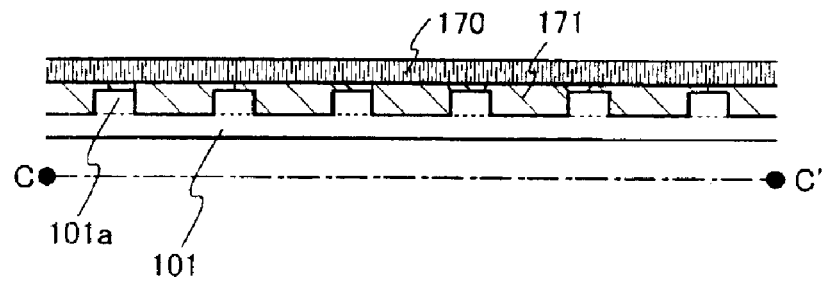

First, the film is formed following the steps in the embodiment mode up to the state of FIGS. 2A and 2B. Then, as shown in FIG. 7A, a mask 170 is used to cover all the film other than the portion serving as the channel forming region of the TFT in the subsequent steps. In this state, the surface of the semiconductor film 103 is being etched to expose the upper surface of the projective portion 101a of the base film 101. Note that FIG. 7B is a sectional view taken along the dashed line B–B' of FIG. 7A and FIG. 7C is a sectional view taken along the dashed line C–C' of FIG. 7A. Through the above steps, a semiconductor film 171 exiting in the depressive portion of the base film 101 is formed. The removal of the semiconductor film 103 from the upper surface may be performed by any method and in this embodiment, etching is used for the removal.

Through this removal from the upper surface, the portion on the projective portion 101a in which the grain boundary exists is removed in a portion covered with no mask. The semiconductor film serving as the channel forming region later and having a satisfactory crystallinity remains above the depressive portion between the projective portions 101a.

Figure 8A:
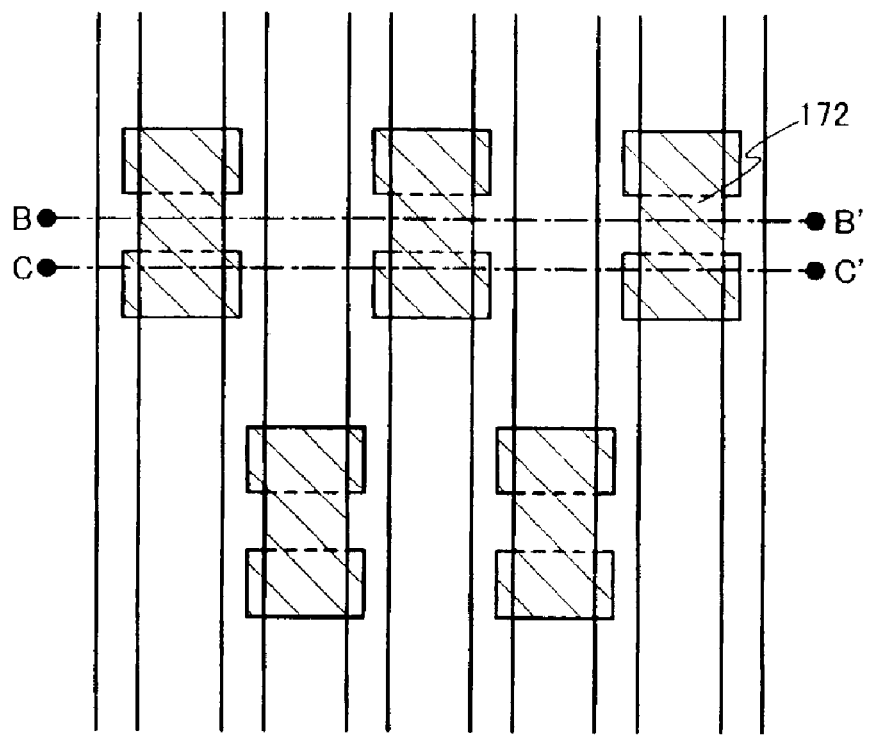
FIGS. 8A to 8C are diagrams showing processes for manufacturing a TFT of the present invention.
Figure 8B:
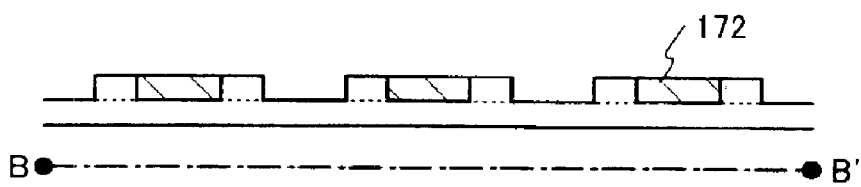
Figure 8C:
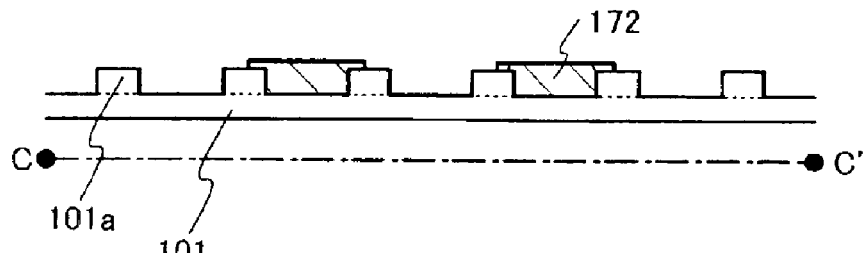

After the film is formed up to the state of FIGS. 7A to 7C, the semiconductor film 171 is patterned to form island-like semiconductor films 172 as shown in FIG. 8A. FIG. 8B is a sectional view taken along the dashed line B–B' of FIG. 8A. FIG. 8C is a sectional view taken along the dashed line C–C' of FIG. 8A. The island-like semiconductor films 172 exhibit difference in thickness between the portion serving as the channel forming region and the portion serving as the source/drain region. Also, the portion serving as the source/drain region may be partially overlapped with the projective portion 101a.

As in this embodiment, the source region and the drain region are partially overlapped with the projective portions 101a, thereby ensuring the wide surface area of the source region and the drain region. Thus, the margin in the layout of the contact holes for wirings connected to the source/drain region can be set large.

Also, when the contact holes are formed in the insulating film formed on the semiconductor film on the flat base film, if the mask for the contact holes is shifted, the base film formed below the semiconductor film is etched, which may involve the following. That is, the electrode formed in contact with the semiconductor film may be cut off in some cases. According to the present invention, in particular, the portions serving as the source region and the drain region of the semiconductor film are formed in contact with the projective portions, so that the projective portions are partially etched instead of the base film arranged below the semiconductor film. Thus, the wirings connected to the source/drain region can be prevented from being cut off.

Embodiment 2

In this embodiment, the semiconductor display device of the present invention for which a flexible substrate is used will be described. The semiconductor display device using the flexible substrate is small in thickness and lightweight. In addition, it can be used for curved display and show window, and the like. Thus, the application thereof is not limited to the portable device and the application range is considerably wide.

In the case of the non-planer substrate, what is aimed at solving relates to a level to which the curvature can be increased. As the curvature of the substrate increases, the stress develops in the insulating film formed on the substrate, which causes the problem in that the semiconductor device formed on the insulating film cannot obtain the desired characteristics. In particular, the larger the insulating film thickness is, the more remarkable the tendency is.

Figure 9:
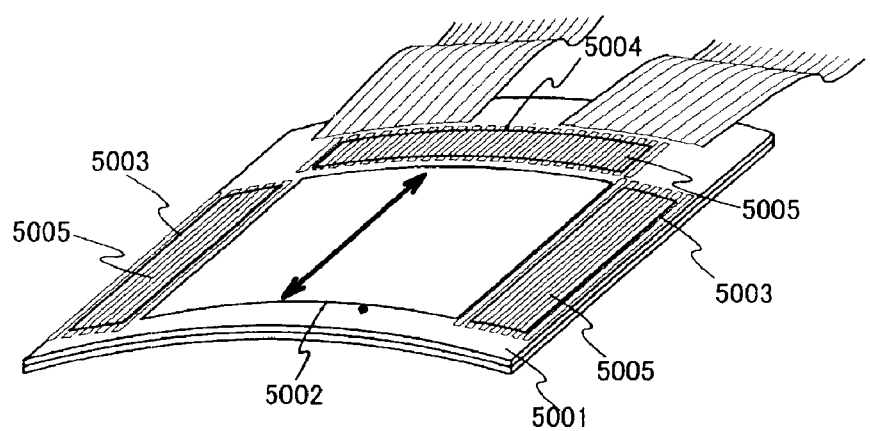
FIG. 9 is an outline diagram of a semiconductor display device of the present invention that uses a flexible substrate.

Accordingly, in this embodiment, the longitudinal direction of the projective portion of the base film formed of the insulating film and a bus direction of the substrate are maintained so as to extend in the same direction. FIG. 9 shows a state in which the semiconductor display device formed by using the flexible substrate is curved. On a substrate 5001, a pixel portion 5002, a scanning line drive circuit 5003, and a signal line drive circuit 5004 are formed. The substrate 5001 is made of materials resistant to the processing temperature in the subsequent steps.

In the scanning line drive circuit. 5003 and signal line drive circuit 5004, the island-like semiconductor film formed on a base film 5005 having the projective portions is used for forming the TFTs. The longitudinal direction of the projective portion of the base film 5005 is identical to the bus direction of the substrate 5001 as indicated by the solid line arrow. In this way, the longitudinal direction of the projective portion of the base film is identical to the bus direction of the substrate and thus, the stress developing in the base film can be dispersed.

This embodiment can be implemented freely in combination with Embodiment 1.

Embodiment 3

In this embodiment, description will be made of an example in which a process of laser light irradiation and a process of crystallizing a semiconductor film by using a catalyst are combined in semiconductor film crystallization. The technique disclosed in JP 06-349735 A can be used, for example, when using a catalytic element.

Figure 10A:
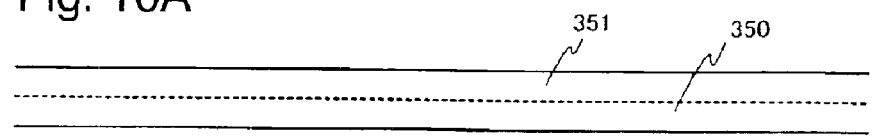
FIGS. 10A to 10G are diagrams showing a flow of crystallization of a semiconductor film of the present invention with the use of a catalytic element.

A first base film 350 made of an insulating film is formed first on a substrate as shown in FIG. 10A. The first base film 350 is formed of silicon oxynitride in this embodiment, but is not limited to this material. Any insulating film may be used provided that it has a high selective ratio in etching with respect to a second base film 351 formed later. The first base film 350 is formed to have a thickness of 50 to 200 nm using $SiH_4$ and $N_2O$ by a CVD apparatus in the embodiment. Note that the first base film may be a single layer, and may also have a laminate structure of a plurality of insulating films.

The second base film 351 is formed next of an insulating film so as to contact the first base film 350. In this embodiment, a silicon oxide film having a thickness of 30 nm to 300 nm is formed as the second base film 351 by using plasma CVD.

Figure 10B:
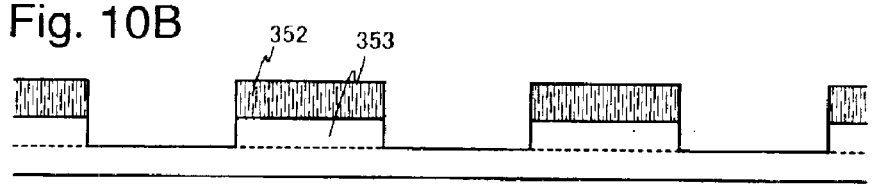

Next, as shown in FIG. 10B, a mask 352 is formed, and the second base film 351 is etched. Note that wet etching is performed in this embodiment at 20° C. using a mixed solution (Stella Chemifa Corporation, product name LAL500) of 7.13% ammonium bifluoride ($NH_4HF_2$), and 15.4% ammonium fluoride ($NH_4F$). Rectangular shape projective portions 353 are formed by this etching. The first base film 350 and the projective portions 353 taken together are considered to be one base film in this specification.

Note that it is preferable to pattern the second base film 351 by using RF sputtering for cases in which aluminum nitride, aluminum oxynitride, or silicon nitride is used for the first base film 350 and silicon oxynitride is used for the second base film 351. As the first base film 350, aluminum nitride, aluminum oxynitride, or silicon nitride have high thermal conductivity, and therefore can quickly diffuse generated heat. Thus, TFT deterioration can thus be avoided.

Figure 10C:
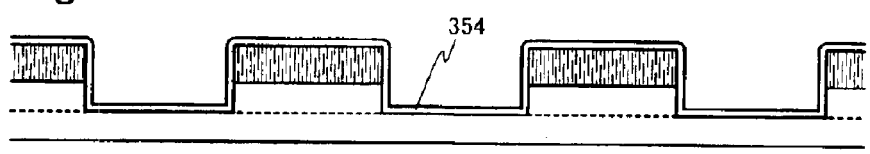

A nickel silicide film 354 (chemical formula NiSix, where $0.4 \leq x \leq 2.5$, for example x=2.0) having a thickness of 5 to 200 Å, for example 20 Å, is formed next as shown in FIG. 10C by sputtering with the mask 352 remaining formed. This nickel silicide film is formed in order to use nickel, which is a group VIII (group 8) element, as a catalytic element for crystallization.

The mask 352 is removed after forming the nickel silicide film 354. A portion 362 of the nickel silicide film 354 formed in the periphery of the mask 352 is removed at this point, and the remainder is in a state remaining between the projective portions 353.

Figure 10D:
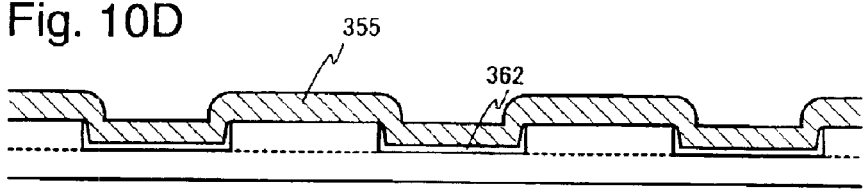

A semiconductor film is formed in the aforementioned state so as to cover the first base film 350, the projective portions 353, and the portion 362 of the nickel silicide film as shown in FIG. 10D. Note that an amorphous silicon film 355 is formed here. The thickness of the projective portions is from 30 nm to 300 nm in this embodiment, and therefore it is preferable to set the film thickness of the amorphous silicon film 355 from 50 to 200 nm, and the thickness is set to 60 nm here.

Figure 10E:
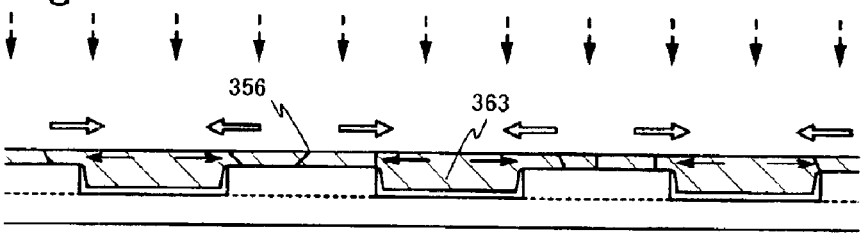

The amorphous silicon film 355 is crystallized next by laser light irradiation, forming a crystalline silicon film 363 (FIG. 10E). The crystalline semiconductor film 363 temporarily melts when the laser light is irradiated, there is volumetric movement from upper portions of the projective portions 353 toward depressive portions as shown by white arrows, and the surface is leveled. The film on the projective portions 353 therefore is thinner. Further, crystallization proceeds from the nickel silicide film 354 disposed in the depressive portions, toward the portions on the projective portions 353, and therefore nickel elements are segregated on the projective portions 353. Consequently, grain boundaries 356 can be easily formed on the projective portions 353.

A process of gettering the catalytic element within the crystalline semiconductor film 363 is explained next. Note that, although gettering is performed after laser light irradiation in this embodiment, it may also be performed after etching the crystalline semiconductor film 363.

Figure 10F:
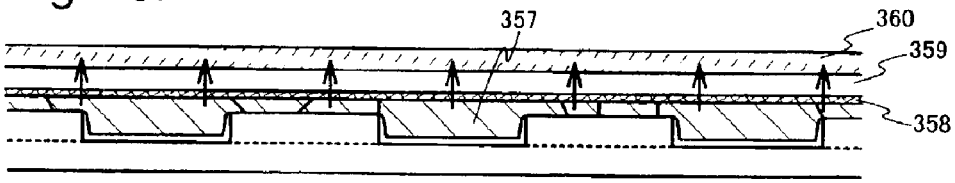
Figure 10G:
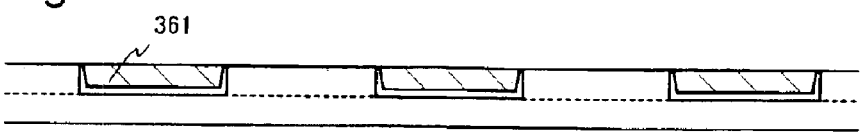

A barrier layer 358 having silicon as its main constituent is formed on the crystalline semiconductor film 363 (FIG. 10F). Note that the barrier layer 358 may be extremely thin, and may be formed of a natural oxide film or formed of an oxide film oxidized by generating ozone through ultraviolet light irradiation under an atmosphere containing oxygen. Further, an oxide film oxidized by a solution containing ozone, which is used in surface processing referred to as hydro washing and performed in order to remove carbon, that is organics, may also be used as the barrier layer 358. The barrier layer 358 is mainly used as an etching stopper. Further, channel doping may be performed after forming the barrier layer 358, and activation may also be performed by irradiating strong light.

A first semiconductor film 359 used for gettering is then formed on the barrier layer 358. The first semiconductor film 359 used for gettering may be a semiconductor film having an amorphous structure, and may also be a semiconductor film having a crystalline structure. The film thickness of the first semiconductor film 359 used for gettering is set from 5 to 50 nm, preferably from 10 to 20 nm. It is preferable to make the first semiconductor film 359 used for gettering contain oxygen (at a concentration equal to or greater than $5 \times 10^{18}/cm^3$, preferably equal to or greater than $1 \times 10^{19}/cm^3$ by SIMS analysis) to increase the gettering efficiency.

A second semiconductor film (gettering site) 360 containing an inert gas element is formed next on the first semiconductor film 359 used for gettering. The second semiconductor film 360 used for gettering may be a semiconductor film having an amorphous structure and formed by plasma CVD, reduced pressure thermal CVD, or sputtering, and may also be a semiconductor film having a crystalline structure. The second semiconductor film may be a semiconductor film that contains an inert gas element at the film formation stage, and may also be added with an inert gas element after forming a semiconductor film that does not contain an inert gas element. An example is shown in this embodiment in which the second semiconductor film 360 used for gettering and containing an inert gas element at the film formation stage, and then is selectively added with an inert gas element, thereby forming the second semiconductor film 360 used for gettering. Further, the first semiconductor film and the second semiconductor film used for gettering may also be formed in succession without exposure to the atmosphere. Furthermore, the sum of the film thickness of the first semiconductor film and the film thickness of the second semiconductor film may be set from 30 to 200 nm, for example 50 nm.

A gap is opened between the crystalline semiconductor film 363 and the second semiconductor film 360 in this embodiment by the first semiconductor film 359 used for gettering. In gettering, there is a tendency for impurity elements such as metals that exist within the crystalline semiconductor film 363 to easily congregate in the vicinity of the gettering site boundary, and therefore it is preferable to increase the gettering efficiency by placing the gettering site boundary far from the crystalline semiconductor film 363 by making use of the first semiconductor film 359 used for gettering, as in this embodiment. In addition, the first semiconductor film 359 used for gettering also has a blocking effect during gettering so that impurity elements contained in the gettering site do not diffuse and reach an interface of the first semiconductor film. Furthermore, the first semiconductor film 359 used for gettering also has a protective effect so that damage is not imparted to the crystalline semiconductor film 363 for cases in which an inert gas element is added.

Gettering is performed next. Heat treatment for one to 24 hours at 450 to 800° C., for example, for 14 hours at 550° C., within a nitrogen atmosphere may be performed as a process for performing gettering. Further, strong light may also be irradiated as a substitute for heat treatment. Strong light may also be irradiated in addition to heat treatment. Furthermore, a substrate may also be heated by a jet of heated gas. In this case heat treatment may be performed at 600 to 800° C., more preferably at 650 to 750° C., for one to 60 minutes. The processing time can be reduced. The impurity elements move to the second semiconductor film 360 by gettering, as shown by the solid line arrows within FIG. 10F, and the removal of, or the reduction in concentration of, the impurity elements contained in the crystalline semiconductor film 363 covered by the barrier layer 358 is performed. Almost none of the contained impurity elements exist due to this gettering. That is, a crystalline semiconductor film (after gettering) 357 is formed so that the impurity element concentration within the film is equal to or less than $1\times10^{18}/cm^3$, preferably equal to or less than $1\times10^{17}/cm^3$.

The first semiconductor film 359 and the second semiconductor film 360 used for gettering are then selectively removed, with the barrier layer 358 as the etching stopper.

After then removing the barrier layer 358 under the changed etching conditions, the crystalline semiconductor film (after gettering) 357 is etched at such a degree that upper surfaces of the projective portions 353 are exposed, as shown in FIG. 10E, thus forming crystalline semiconductor films 361 in the depressive portions after etching.

Note that gettering may also employ the technique described in JP 10-135468 A, JP 10-135469 A, or the like.

A different laser light may also be irradiated after promoting crystallization with the catalytic element through not laser light irradiation but heat treatment in this embodiment. Further, a different laser light may also be irradiated only to the driver circuits after promoting crystallization with the catalytic element through not laser light irradiation but heat treatment in this embodiment. In addition, a catalytic element may also be added only in the driver circuits, and crystallization may be promoted by using laser light. Further, a different laser light may also be irradiated after promoting crystallization with the catalytic element through heat treatment only to the driver circuits.

It is possible to implement this embodiment in combination with Embodiment 1 or Embodiment 2.

Embodiment 4

A method of forming a base film having unevenness will be explained in Embodiment 4.

Figure 11A:
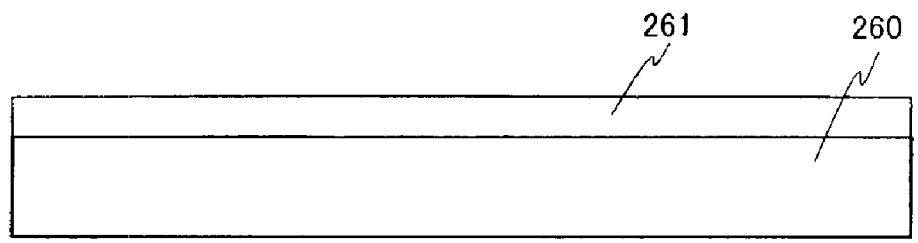
FIGS. 11A to 11C are diagrams showing a method of manufacturing a base film having projective portions.

A first base film made from an insulating film is first formed on a substrate 260 as shown in FIG. 11A. The first base film is formed by a silicon oxide film, a silicon nitride film, a silicon oxynitride film, or the like.

If a silicon oxide film is used, it can be formed by plasma CVD by mixing tetraethyl orthosilicate (TEOS) and $O_2$, at a reaction pressure of 40 Pa, at a substrate temperature of 300 to 400° C., and by discharging at a high frequency (13.56 MHz) electric power density of 0.5 to 0.8 W/cm². If a silicon oxynitride film is used, it may be formed by a silicon oxynitride film manufactured by plasma CVD from $SiH_4$, $N_2O$, and $NH_3$, or by a silicon oxynitride film manufactured by plasma CVD from $SiH_4$ and $N_2O$. The manufacturing conditions in this case are that formation can occur at a reaction pressure of 20 to 200 Pa, a substrate temperature of 300 to 400° C., and a high frequency (60 MHz) electric power density of 0.1 to 1.0 W/cm². Further, a hydrogen silicon oxynitride film manufactured from $SiH_4$, $N_2O$, and $H_2$ may also be applied. It is possible to manufacture silicon nitride films similarly by plasma CVD using $SiH_4$ and $NH_3$.

Figure 11B:
Figure 11C:
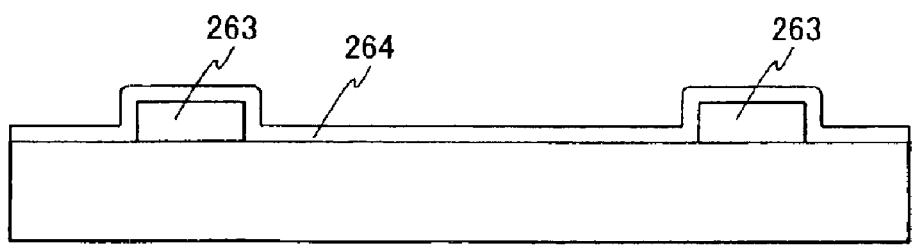

After forming the first base film over the entire substrate to have a thickness of 20 to 200 nm (preferably between 30 and 60 nm), a mask 262 is then formed as shown in FIG. 11B by using a photolithography technique. Unnecessary portions are then removed by etching, thus forming rectangular shape projective portions 263. A dry etching method that uses a fluoride gas with respect to the first base film 261 may be used, and a wet etching method that uses an aqueous solution of a fluoride may be used. In the case where the latter method is selected, etching may be performed by a mixed solution (Stella Chemifa Corporation, product name LAL500) containing 7.13% ammonium hydrogen fluoride ($NH_4HF_2$) and 15.4% ammonium fluoride ($NH_4F$).

A second base film 264 made from an insulating film is formed next so as to cover the projective portions 263 and the substrate 260. This film is formed by using a silicon oxide film, a silicon nitride film, a silicon oxynitride film, or the like at a thickness from 50 to 300 nm (preferably from 100 to 200 nm), similar to the first base film 261.

A base film composed of the projective portions 263 and the second base film 264 is formed in accordance with the above manufacturing processes. Note that impurities can be prevented from mixing in between the semiconductor film and the base film by forming the semiconductor film in succession, without exposure to the atmosphere, after forming the second base film 264.

This embodiment can be implemented freely in combination with Embodiments 1 to 3.

Embodiment 5

TFTs, which have island shape semiconductor films between projective portions, can be used to, not only driver circuits, but also other circuits, which semiconductor display devices have. In Embodiment 5, a description will be made of a structure of a controller which uses the TFTs having island shape semiconductor films between projective portions. Note that in this embodiment, a structure of the controller of a light emitting device using an OLED (organic light emitting device) will be described. However, the present invention is not limited to this but may adopt a controller of the liquid crystal display device and those of other semiconductor display devices. Also, it may be a drive circuit other than the controller and a semiconductor device other than the display device is also possible.

Figure 13:
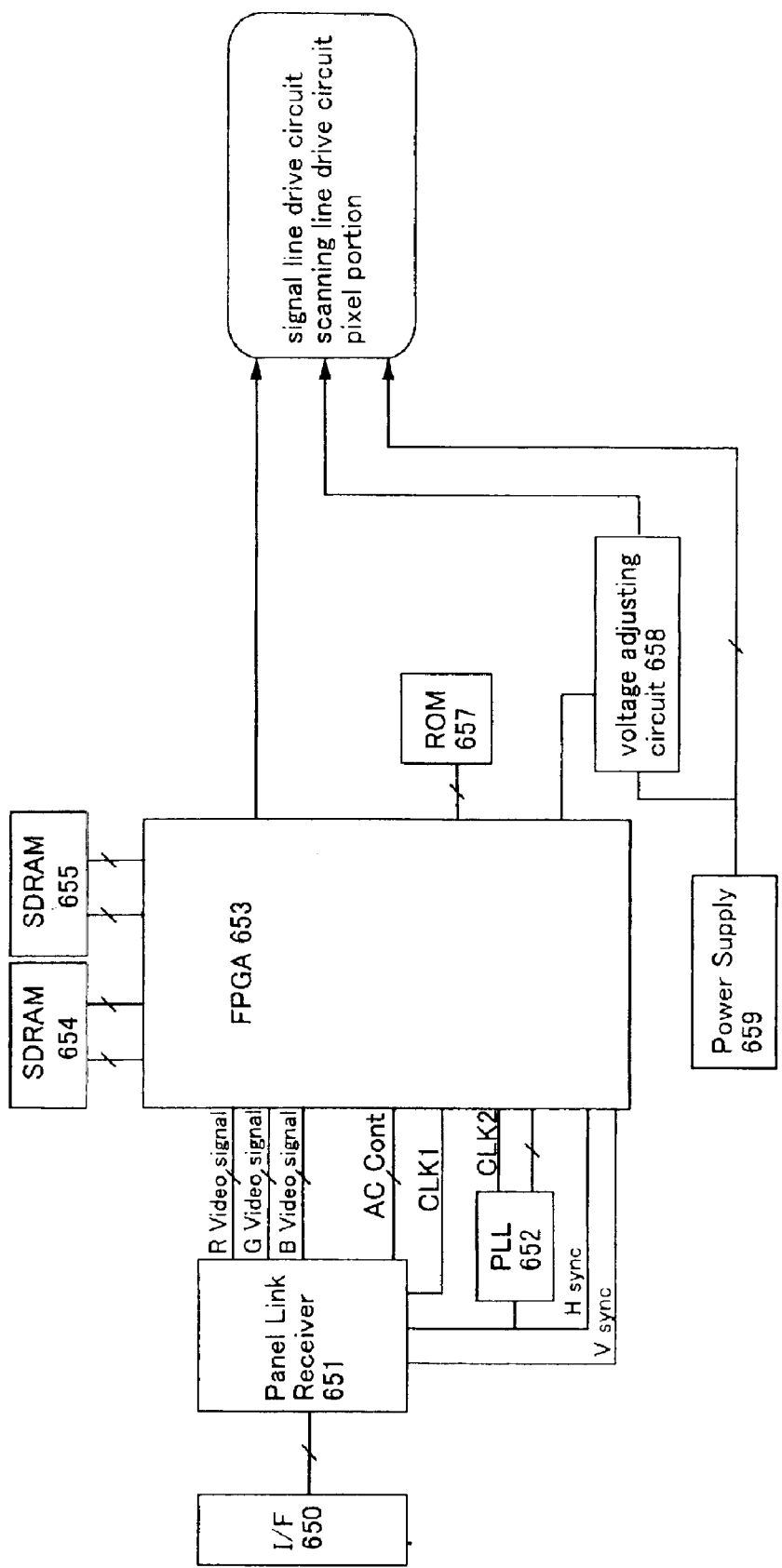
FIG. 13 is a block diagram showing the structure of a controller of a light emitting device as an example of a semiconductor display device of the present invention.

FIG. 13 shows the structure of the controller of this embodiment. The controller includes an interface (I/F) 650, a panel link receiver 651, a phase locked loop (PLL) 652, a signal converting portion (FPGA: field programmable logic device) 653, SDRAMs (synchronous dynamic random access memories) 654 and 655, a ROM (read only memory) 657, a voltage adjusting circuit 658, and a power supply 659. Note that in this embodiment, the SDRAM is used, but a DRAM (dynamic random access memory) or an SRAM (static random access memory) can be also used instead of the SDRAM provided that high-speed data writing and reading are possible.

Digital video signals inputted in the semiconductor display device through the interface 650 are subjected to parallel/serial conversion at the panel link receiver 651 into digital video signals corresponding to the respective colors of R, G, and B, which are inputted into the signal converting portion 653.

Also, based on the various signals inputted to the semiconductor display device through the interface 650, an Hsync signal, a Vsync signal, a clock signal CLK, and an alternating voltage are generated at the panel link receiver 651 and inputted to the signal converting portion 653.

The phase locked loop 652 has a function of making in-phase the frequencies of various signals inputted to the semiconductor display device and the operating frequency of the signal converting portion 653. The operating frequency of the signal converting portion 653 does not always conform with the frequencies of the various signals inputted to the semiconductor display device. The phase locked loop 652 adjusts the operating frequency of the signal converting portion 653 in synchronism with the frequencies of the various signals.

The ROM 657 stores a program for controlling the operation of the signal converting portion 653 and the signal converting portion 653 operates according to the program.

The digital video signals inputted to the signal converting portion 653 are temporarily written into the SDRAMs 654 and 655 and held. The signal converting portion 653 reads the digital video signals corresponding to all the pixels on a bit basis among the digital video signals of all bits held in the SDRAM 654. The read signals are inputted to the signal line drive circuit.

The signal converting portion 653 inputs information on the length of the light emission period of the OLED corresponding to each bit into the scanning line drive circuit.

The voltage adjusting circuit 658 adjusts the voltage applied between the anode and the cathode of the OLED of each pixel in synchronism with the signal inputted from the signal converting portion 653. The power supply 659 supplies the voltage at a given level to the voltage adjusting circuit 658, the signal line drive circuit, the scanning line drive circuit, and the pixel portion.

The present invention can be used to, among the various circuits in the controller, any circuit, if obtained by using the TFTs, such as CPUs, memories, various processors, and the like.

The drive circuit and the controller used in the present invention are not limited to the structures described in this embodiment. This embodiment can be implemented freely in combination with Embodiments 1 to 4.

Embodiment 6

The semiconductor device equipped with the TFT formed by the present invention can be applied to various electronic apparatuses. Examples of the electronic apparatuses are portable information terminals (electronic books, mobile computers, cellular phones, or the like), video cameras, digital cameras, personal computers, TV receivers, cellular phones, projection display apparatuses, or the like. Specific examples of these electronic apparatuses are shown in FIGS. 14A to 14H.

Figure 14A:
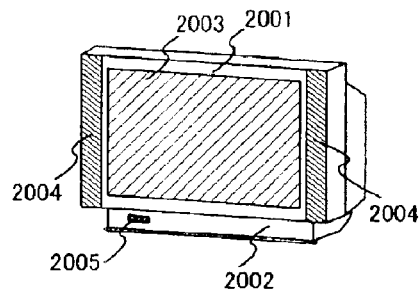
FIGS. 14A to 14H are diagrams each showing an electronic device that use a semiconductor display device of the present invention.

FIG. 14A shows a display apparatus, which is composed of a case 2001, a support base 2002, a display unit 2003, speaker units 2004, a video input terminal 2005, etc. The display apparatus of the present invention is completed by using the semiconductor device of the present invention to the display unit 2003. The display device refers to all display devices for displaying information, including ones for personal computers, for TV broadcasting reception, and for advertisement.

Figure 14B:
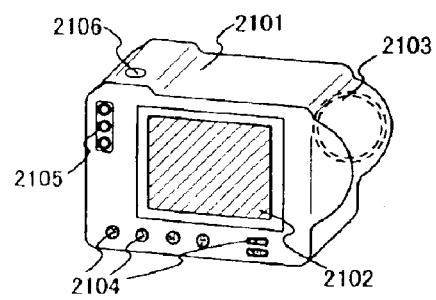

FIG. 14B shows a digital still camera, which is composed of a main body 2101, a display unit 2102, an image receiving unit 2103, operation keys 2104, an external connection port 2105, a shutter 2106, etc. The digital still camera of the present invention is completed by using the semiconductor device of the present invention to the display unit 2102.

Figure 14C:
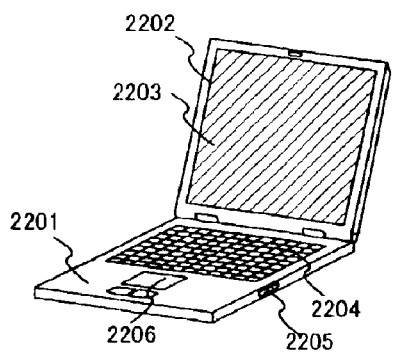

FIG. 14C shows a notebook personal computer, which is composed of a main body 2201, a case 2202, a display unit 2203, a keyboard 2204, an external connection port 2205, a pointing mouse 2206, etc. The notebook personal computer of the present invention is completed by using the semiconductor device of the present invention to the display unit 2203.

Figure 14D:
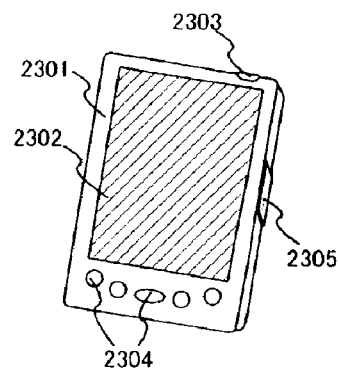

FIG. 14D shows a mobile computer, which is composed of a main body 2301, a display unit 2302, a switch 2303, operation keys 2304, an infrared port 2305, etc. The mobile computer of the present invention is completed by using the semiconductor device of the present invention to the display unit 2302.

Figure 14E:
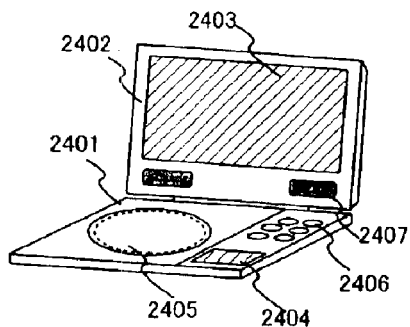

FIG. 14E shows a portable image reproducing device equipped with a recording medium (a DVD player, to be specific). The device is composed of a main body 2401, a case 2402, a display unit A 2403, a display unit B 2404, a recording medium (DVD or the like) reading unit 2405, operation keys 2406, speaker units 2407, etc. The display unit A 2403 mainly displays image information whereas the display unit B 2404 mainly displays text information. Note that the image reproducing device equipped with a recording medium includes domestic game machines. The portable image reproducing device of the present invention is completed by using the semiconductor device of the present invention to the display units A 2403 and B 2404.

Figure 14F:
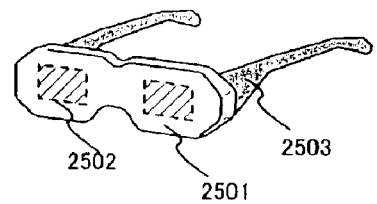

FIG. 14F shows a goggle type display (head mounted display), which is composed of a main body 2501, display units 2502, and arm units 2503. The goggle type display of the present invention is completed by using the semiconductor device of the present invention to the display units 2502.

Figure 14G:
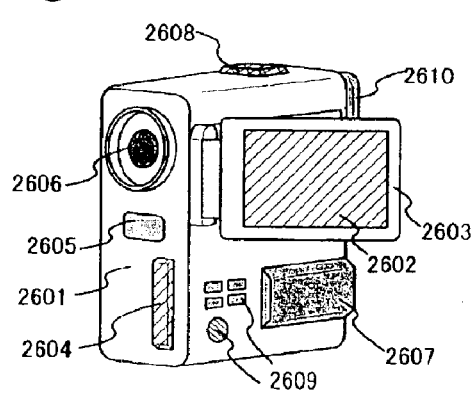

FIG. 14G shows a video camera, which is composed of a main body 2601, a display unit 2602, a case 2603, an external connection port 2604, a remote control receiving unit 2605, an image receiving unit 2606, a battery 2607, an audio input unit 2608, operation keys 2609, eye piece portion 2610 etc. The video camera of the present invention is completed by using the semiconductor device of the present invention to the display unit 2602.

Figure 14H:
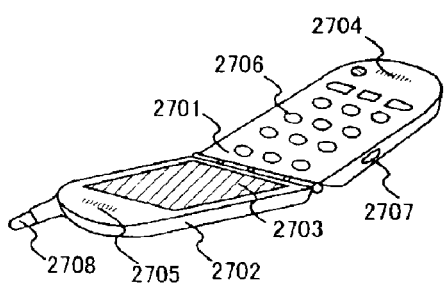

FIG. 14H shows a cellular phone, which is composed of a main body 2701, a case 2702, a display unit 2703, an audio input unit 2704, an audio output unit 2705, operation keys 2706, an external connection port 2707, an antenna 2708, etc. If the display unit 2703 displays white letters on black background, the cellular phone consumes less power. The cellular phone of the present invention is completed by using the semiconductor device of the present invention to the display unit 2703.

As described above, the application range of the present invention is so wide that it is applicable to electric apparatuses of any field. This embodiment can be implemented by combining with any structure of Embodiments 1 to 5.

Embodiment 7

In this embodiment, a description will be given of an embodiment of connection between the semiconductor film formed between the projective portions and wirings connected with impurity regions of the semiconductor film.

Figure 15A:
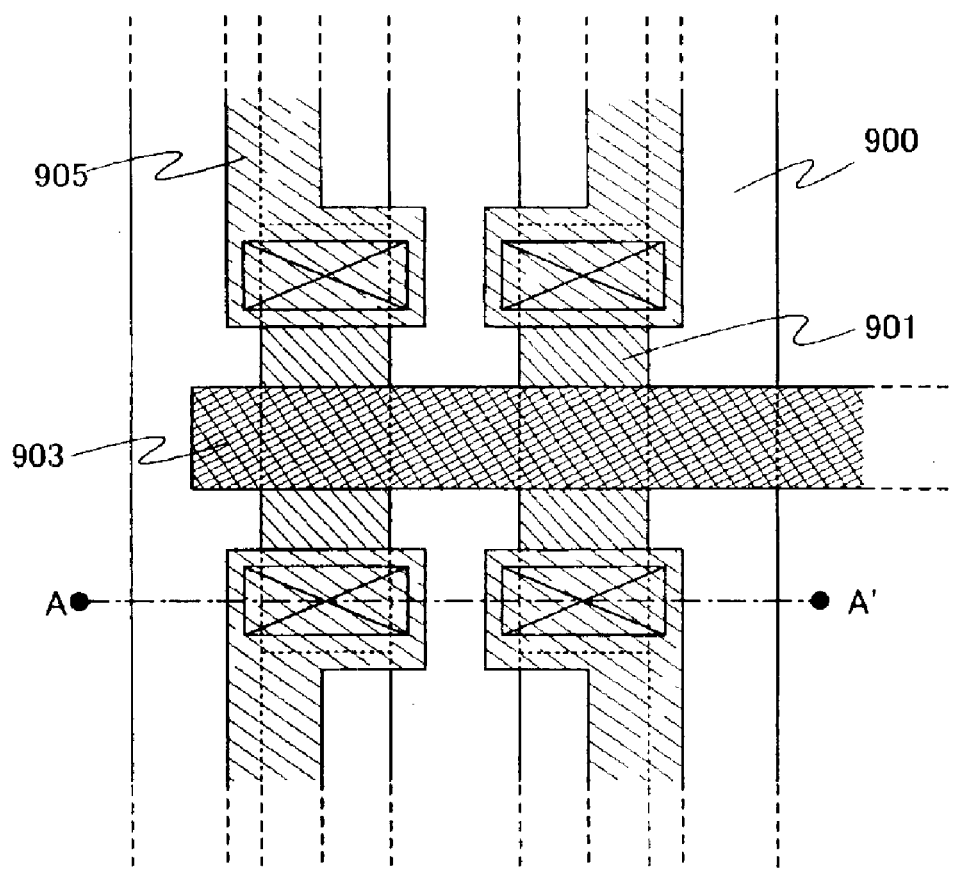
FIGS. 15A and 15B are an upper surface diagram and a cross sectional diagram, respectively, of a plurality of TFTs formed on a base film.
Figure 15B:
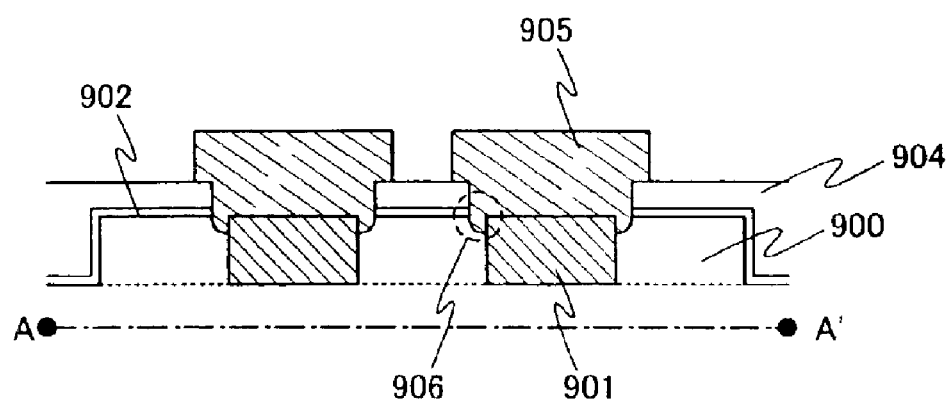
Figure 16:
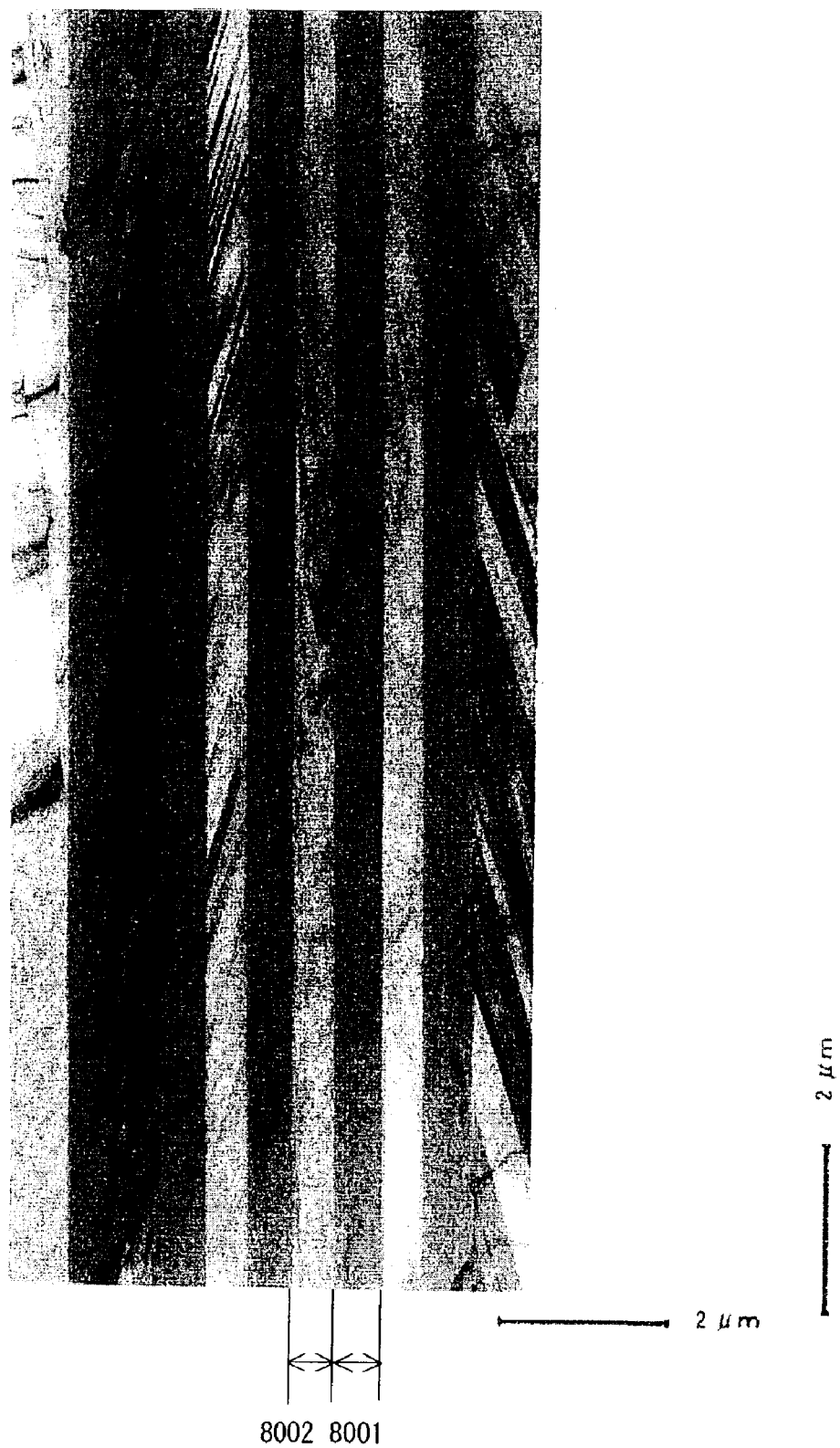
FIG. 16 shows a TEM image, which is seen form an upper surface, of a semiconductor film which is formed on a base film having a projective portion and then is crystallized by laser light irradiation.
Figure 17:
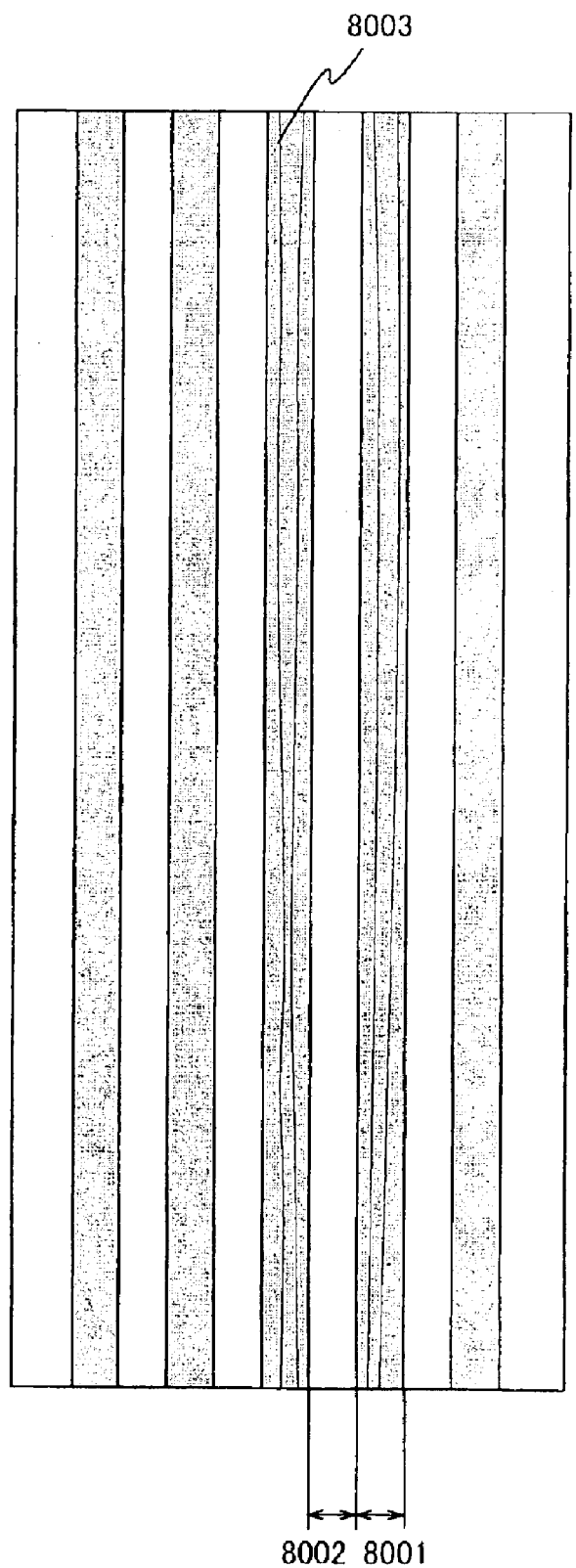
FIG. 17 is a schematic diagram of the TEM image of FIG. 16.
Figure 18:
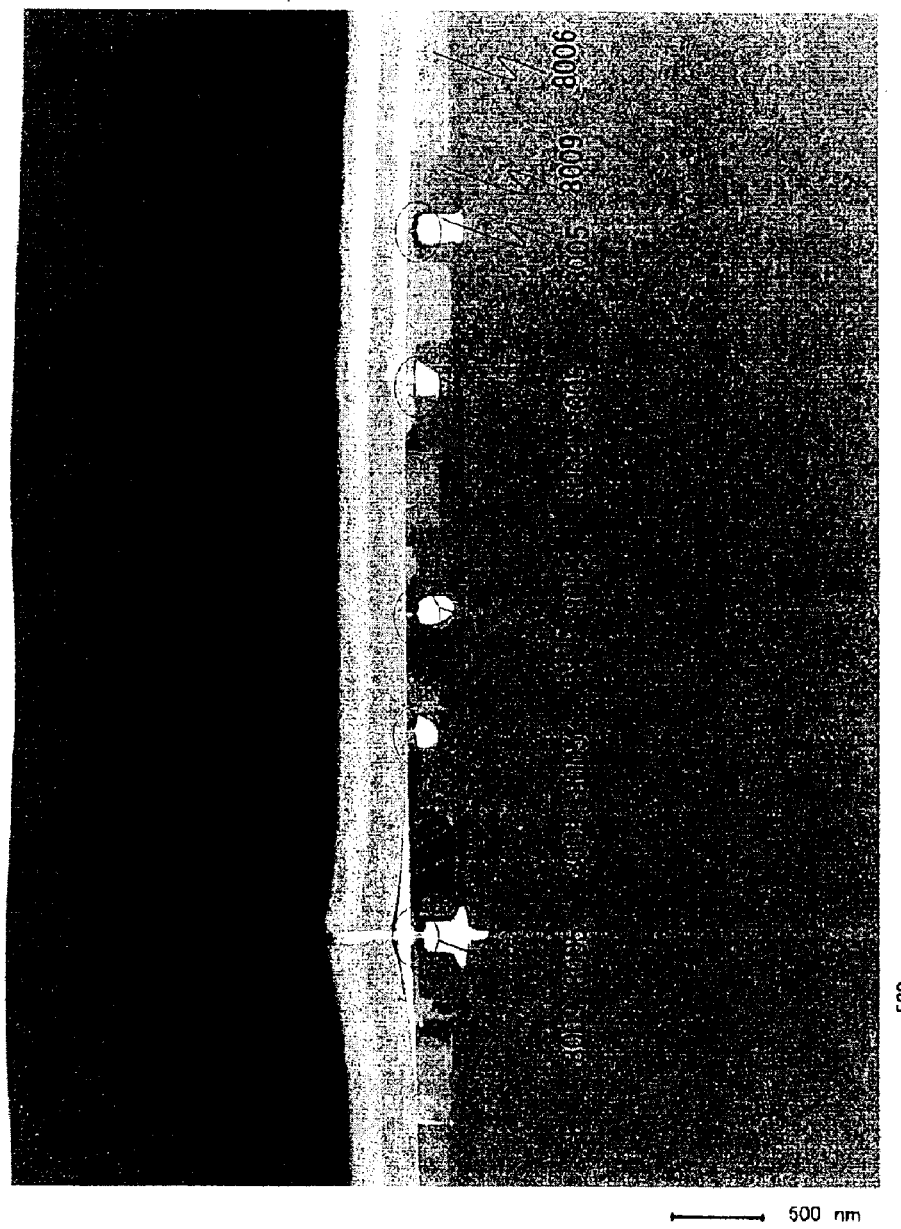
FIG. 18 shows a TEM image, which is seen in cross section, of a semiconductor film which is formed on a base film having a projective portion, is crystallized by laser light irradiation, and then is subjected to Secco etching.
Figure 19A:
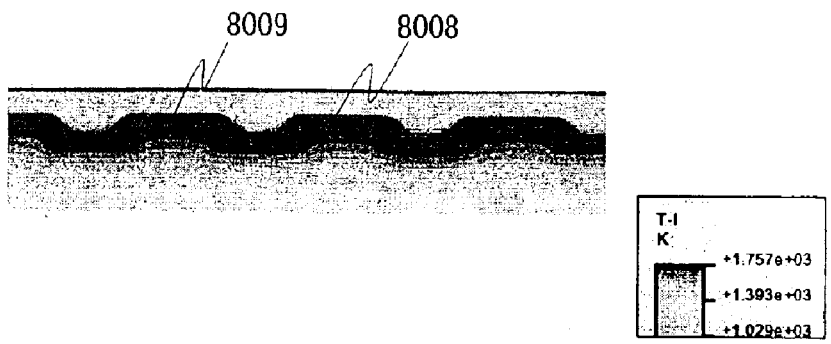
FIGS. 19A to 19F are diagrams showing temporal changes in a temperature distribution in performing laser light irradiation to silicon formed on a base film having unevenness.
Figure 19B:
Figure 19C:
Figure 19D:
Figure 19E:
Figure 19F:
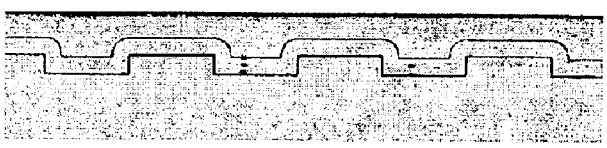
Figure 20:
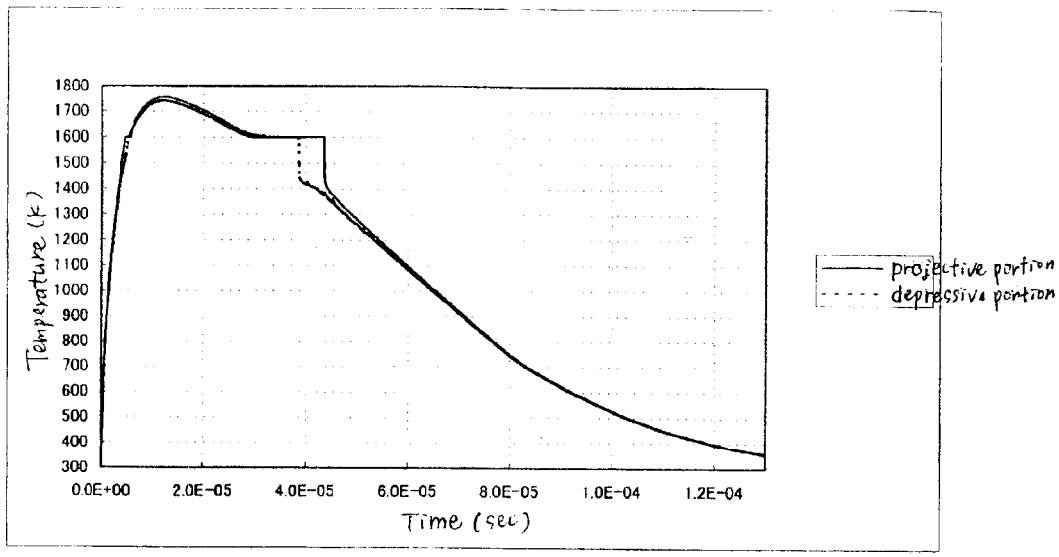
FIG. 20 is a diagram showing temporal changes in a temperature in performing laser light irradiation to silicon formed on a base film having unevenness.
Figure 21:
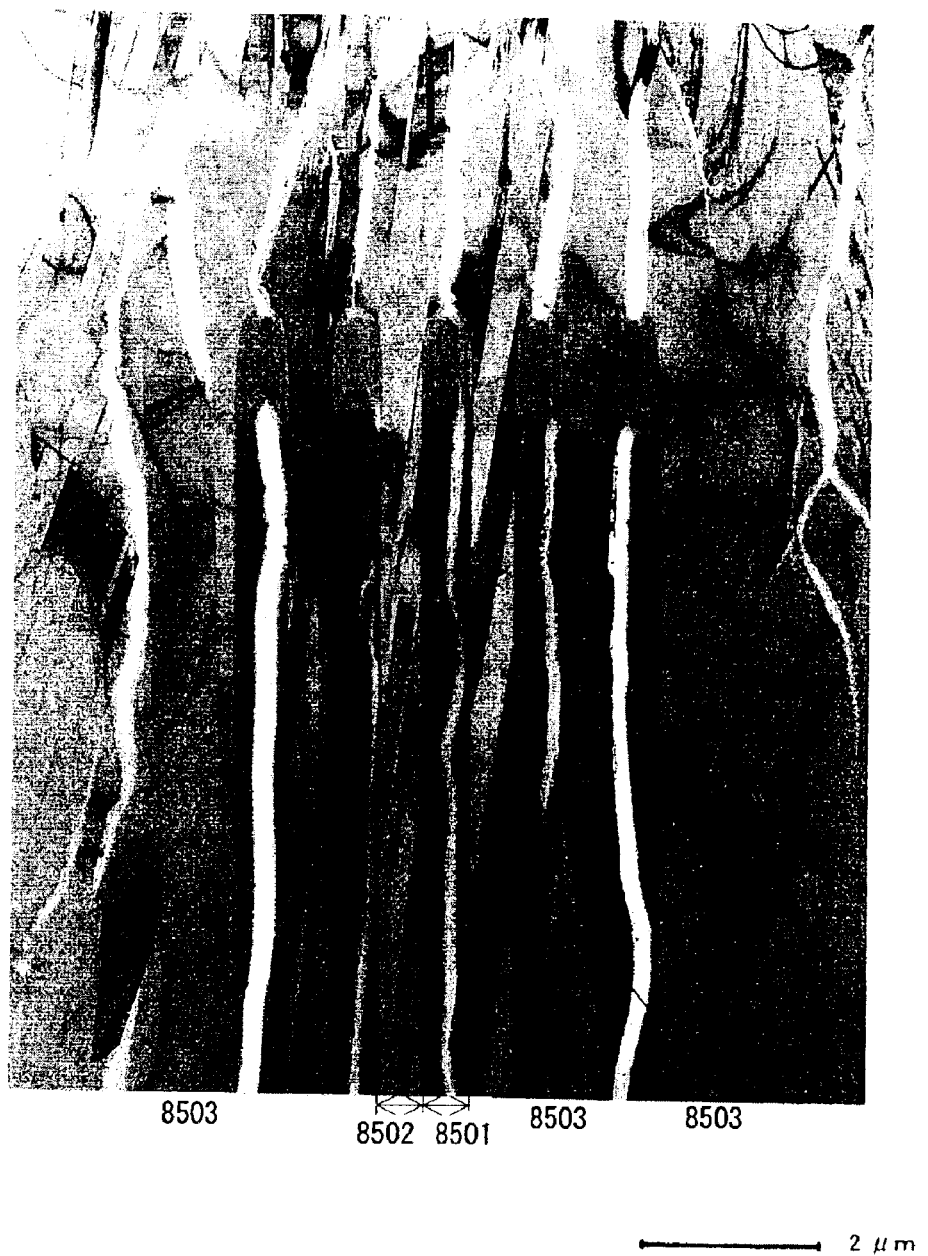
FIG. 21 shows a TEM image, which is seen in cross section, of a semiconductor film which is formed on a base film having a projective portion, is crystallized by laser light irradiation, and then is subjected to Secco etching.

FIG. 15A is a top view showing a TFT formed on the base film having the projective portions 900. Also, FIG. 15B is a sectional view taken along the line A–A' of FIG. 15A. On a semiconductor film 901 formed between the projective portions 900, a gate insulating film 902 is formed and a gate electrode 903 is formed on the gate insulating film 902. Also, an interlayer insulating film 904 is formed so as to cover the gate electrode 903 and the gate insulating film 902.

Through contact holes formed in the gate insulating film 902 and the interlayer insulating film 904, wirings 905 formed on the interlayer insulating film 904 and the impurity regions of the semiconductor film 901 come into contact with each other.

In this embodiment, when opening the contact holes to the gate insulating film 902 and the interlayer insulating film 904, the contact holes are widely opened to such an extent as to expose a part of the projective portion 900. In the present invention, the portion serving as the source/drain region in the island shape semiconductor film on the depressive portion is in contact with the projective portion. As shown in a region surrounded by dashed line 906, even if the projective portion 900 is partially etched somewhat, differing from the case of forming on the flat base film, etching does not proceed up to the base film formed below the island shape semiconductor film. Thus, the breakage of the wirings hardly occurs. If the contact hole can be opened widely to such an extent as to expose a part of the projective portion 900, the design rule is relaxed upon the formation of wirings. Further, this makes it possible to reduce the resistance of the connection portion of the island shape semiconductor film 901 and the wiring 905 as well.

This embodiment can be implemented freely in combination with Embodiments 1 to 6.

Embodiment 8

The present invention can be applied to various semiconductor display devices. An embodiment of a semiconductor display device of the present invention is explained using FIG. 22A.

Figure 22A:
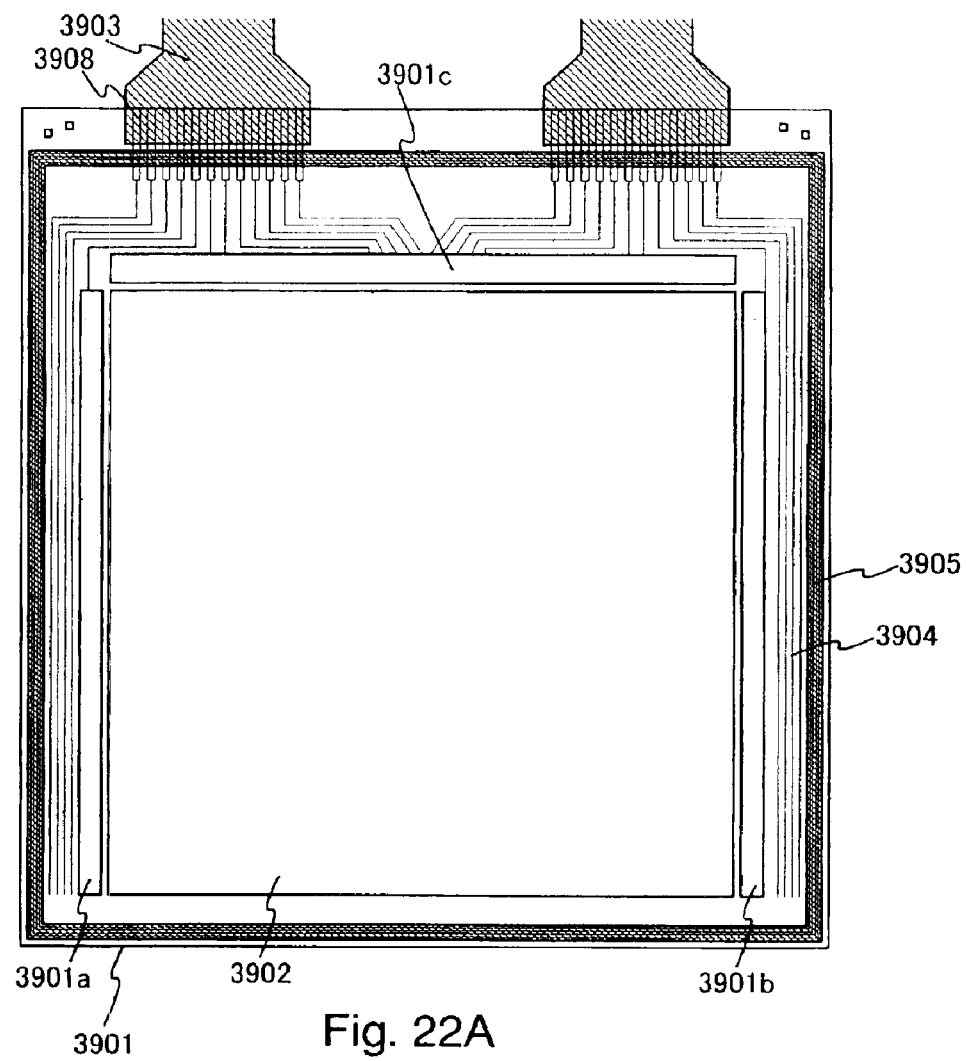
FIGS. 22A and 22B are final drawings of a semiconductor display device of the present invention.

A semiconductor display device shown in FIG. 22A is provided with a pixel portion 3902, scanning line driver circuits 3901a and 3901b, a signal line driver circuit 3901c, an input/output terminal portion 3908, and a wiring or wiring group 3904 on a substrate 3901. A shield pattern 3905 may cover portions of the scanning line driver circuits 3901a and 3901b, the signal line driver circuit 3901c, and the wiring or wiring group 3904 that connects the driver circuit portions to input terminals. The surface area of a frame region of a panel (peripheral region of the pixel portion) can thus be reduced. An FPC 3903 is bonded to an external input/output terminal portion.

In the present invention, island shape semiconductor films crystallized by utilizing unevenness formed in a base film are formed in the scanning line driver circuits 3901a and 3901b and the signal line driver circuit 3901c, and many types of elements are formed using the island shape semiconductor films.

Figure 22B:
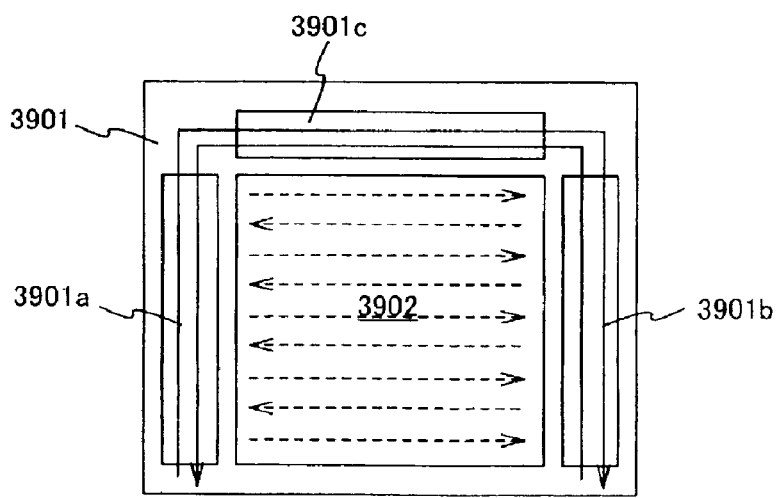

An embodiment of a path for irradiating laser light to the substrate 3901 is explained using FIG. 22B. In this embodiment, laser light is irradiated to semiconductor films that become the signal line driver circuit 3901c and the scanning line driver circuits 3901a and 3901b in accordance with a continuous scanning path shown by solid line arrows. Laser light is then irradiated to a semiconductor film that becomes the pixel portion 3902 in accordance with a scanning path shown by dashed line arrows. In this case, unevenness formed in insulating films of the signal line driver circuit 3901c and the scanning line driver circuits 3901a and 3901b is formed along the laser light scanning path shown by the solid line arrows.

It is possible to implement Embodiment 8 by being freely combined with any of Embodiments 1 to 7.

The formation of grain boundaries in the TFT channel forming region can be avoided with the present invention by actively using the island shape semiconductor films located on the depressive portions of the base film as the TFT active layers. Substantial reduction in TFT mobility, reduction in on current, and increase in off current due to the grain boundaries can be avoided. Note that designers can suitably determine just how much material is removed by patterning in the vicinity of projective portion or depressive portion edges.

In particular, TFTs having the aforementioned structure are used not in the pixel portion for displaying an image in a semiconductor display device, but rather in the driver circuit for supplying a video signal and other signals to the pixel portion. It is necessary to drive the driver circuit at a higher frequency than that for the pixel portion, and therefore it is extremely effective to use the above-structured TFT of the present invention. Further, an on current having a desired value can be obtained with the increase in crystallinity of the active layer, even if the size of the active layer is suppressed. The surface area of the entire driver circuit can therefore be held down. As a result, the ratio of the driver circuit to the overall semiconductor display device can be held down.

Further, according to the present invention, the island shape semiconductor films are formed on the flat base film without daring to form the projective portions having the aforementioned structure in the pixel portion. Transmittivity varies in the pixel portion depending on the layout of the island shape semiconductor films that function as TFT active layers or capacitance electrodes. As to layout of the island shape semiconductor films, design restrictions for the pixel portion are therefore largely more complicated than those for the driver circuit, and it is difficult to lay out the island shape semiconductor films between the projective portions disposed in parallel. In addition, the pixel portion does not require high-speed operation compared to the driver circuits, and therefore it does not become much of a problem even if the TFTs are not used in which the above-structured island shape semiconductor films are used as their active layers. On the contrary, this reduces design restrictions on the layout of the island shape semiconductor films, and is therefore preferable.

What is claimed is:

1. A semiconductor display device comprising:
a pixel portion and a driver circuit comprising thin film transistors, each of the thin film transistors comprising:
a base film;
an active layer having at least two impurity regions and a channel forming region between the two impurity regions, and over the base film;
a gate insulating film in contact with the active layer; and
a gate electrode overlapping with the channel forming region interposing the gate insulating film therebetween,
wherein the base film has a plurality of rectangular shape or stripe shape projective portions only in the driver circuit,
wherein the active layer of the thin film transistor of the driver circuit exists between the plurality of projective portions so as to contact with the projective portion, and
wherein the active layer of the thin film transistor of the driver circuit is crystallized by laser light.

2. A semiconductor display device according to claim 1, wherein the height of the plurality of projective portions is from 0.01 $\mu$m to 3 $\mu$m.

3. A semiconductor display device according to claim 1, wherein the height of the plurality of projective portions is from 0.01 $\mu$m to 1 $\mu$m.

4. A semiconductor display device according to claim 1, wherein the width between the plurality of projective portions is from 0.01 $\mu$m to 2 $\mu$m.

5. A semiconductor display device according to claim 1, wherein the laser light is output by using one type or a plurality of types selected from the group consisting of YAG lasers, $YVO_4$ lasers, YLF lasers, $YAlO_3$ lasers, glass lasers, ruby lasers, Alexandrite lasers, Ti:sapphire lasers, and $Nd:YVO_4$ lasers.

6. A semiconductor display device according to claim 1, wherein the laser light is continuous wave laser light.

7. A semiconductor display device according to claim 1, wherein the semiconductor display device is applied to an electronic apparatus selected from the group consisting of a digital still camera, a notebook personal computer, a mobile computer, a DVD player, a goggle type display, a video camera and a cellular phone.

8. A semiconductor display device comprising:
a pixel portion and a driver circuit comprising thin film transistors, each of the thin film transistors comprising:
a base film;
an active layer having at least two impurity regions and a channel forming region between the two impurity regions, and over the base film;
a gate insulating film in contact with the active layer; and
a gate electrode overlapping with the channel forming region interposing the gate insulating film therebetween,
wherein the base film has a plurality of rectangular shape or stripe shape projective portions only in the driver circuit,
wherein the active layer of the thin film transistor of the driver circuit exists between the plurality of projective portions such that a portion of the active layer overlaps with the projective portion, and
wherein the active layer of the thin film transistor of the driver circuit is crystallized by laser light.

9. A semiconductor display device according to claim 8, wherein the height of the plurality of projective portions is from 0.01 $\mu$m to 3 $\mu$m.

10. A semiconductor display device according to claim 8, wherein the height of the plurality of projective portions is from 0.01 $\mu$m to 1 $\mu$m.

11. A semiconductor display device according to claim 8, wherein the width between the plurality of projective portions is from 0.01 $\mu$m to 2 $\mu$m.

12. A semiconductor display device according to claim 8, wherein the laser light is output by using one type or a plurality of types selected from the group consisting of YAG lasers, $YVO_4$ lasers, YLF lasers, $YAlO_3$ lasers, glass lasers, ruby lasers, Alexandrite lasers, Ti:sapphire lasers, and $Nd:YVO_4$ lasers.

13. A semiconductor display device according to claim 8, wherein the laser light is continuous wave laser light.

14. A semiconductor display device according to claim 8, wherein the semiconductor display device is applied to an electronic apparatus selected from the group consisting of a digital still camera, a notebook personal computer, a mobile computer, a DVD player, a goggle type display, a video camera and a cellular phone.

15. A semiconductor display device comprising:
a pixel portion and a driver circuit comprising thin film transistors, each of the thin film transistors comprising:
a base film;
an active layer having at least two impurity regions and a channel forming region between the two impurity regions, and over the base film;
a gate insulating film in contact with the active layer; and
a gate electrode overlapping with the channel forming region interposing the gate insulating film therebetween,
wherein the base film has a plurality of rectangular shape or stripe shape projective portions only in the driver circuit,
wherein the channel forming region is thinner than the two impurity regions in the active layer of the thin film transistor of the driver circuit, and
wherein the active layer of the thin film transistor of the driver circuit exists between the plurality of projective portions such that a portion of the active layer overlaps with the projective portion,
wherein the active layer of the thin film transistor of the driver circuit is crystallized by laser light.

16. A semiconductor display device according to claim 15, wherein the height of the plurality of projective portions is from 0.01 $\mu$m to 3 $\mu$m.

17. A semiconductor display device according to claim 15, wherein the height of the plurality of projective portions is from 0.01 $\mu$m to 1 $\mu$m.

18. A semiconductor display device according to claim 15, wherein the width between the plurality of projective portions is from 0.01 $\mu$m to 2 $\mu$m.

19. A semiconductor display device according to claim 15, wherein the laser light is output by using one type or a plurality of types selected from the group consisting of YAG lasers, $YVO_4$ lasers, YLF lasers, $YAlO_3$ lasers, glass lasers, ruby lasers, Alexandrite lasers, Ti:sapphire lasers, and $Nd:YVO_4$ lasers.

20. A semiconductor display device according to claim 15, wherein the laser light is continuous wave laser light.

21. A semiconductor display device according to claim 15, wherein the semiconductor display device is applied to an electronic apparatus selected from the group consisting of a digital still camera, a notebook personal computer, a mobile computer, a DVD player, a goggle type display, a video camera and a cellular phone.

22. A semiconductor display device comprising:
   a pixel portion, a driver circuit and a controller comprising thin film transistors, each of the thin film transistors comprising:
      a base film;
      an active layer having at least two impurity regions and a channel forming region between the two impurity regions, and over the base film;
      a gate insulating film in contact with the active layer; and
      a gate electrode overlapping with the channel forming region interposing the gate insulating film therebetween,
   wherein the base film has a plurality of rectangular shape or stripe shape projective portions only in the driver circuit and the controller,
   wherein the active layer of the thin film transistor of each of the driver circuit and the controller exists between the plurality of projective portions so as to contact with the projective portion, and
   wherein the active layer of the thin film transistor of each of the driver circuit and the controller is crystallized by laser light.

23. A semiconductor display device according to claim 22, wherein the controller comprises a CPU and a memory.

24. A semiconductor display device according to claim 22, wherein the height of the plurality of projective portions is from 0.01 µm to 3 µm.

25. A semiconductor display device according to claim 22, wherein the height of the plurality of projective portions is from 0.01 µm to 1 µm.

26. A semiconductor display device according to claim 22, wherein the width between the plurality of projective portions is from 0.01 µm to 2 µm.

27. A semiconductor display device according to claim 22, wherein the laser light is output by using one type or a plurality of types selected from the group consisting of YAG lasers, YVO$_4$ lasers, YLF lasers, YAlO$_3$ lasers, glass lasers, ruby lasers, Alexandrite lasers, Ti:sapphire lasers, and Nd:YVO$_4$ lasers.

28. A semiconductor display device according to claim 22, wherein the laser light is continuous wave laser light.

29. A semiconductor display device according to claim 22, wherein the semiconductor display device is applied to an electronic apparatus selected from the group consisting of a digital still camera, a notebook personal computer, a mobile computer, a DVD player, a goggle type display, a video camera and a cellular phone.

30. A semiconductor display device comprising:
   a pixel portion, a driver circuit and a controller comprising thin film transistors, each of the thin film transistors comprising:
      a base film;
      an active layer having at least two impurity regions and a channel forming region between the two impurity regions, and over the base film:
      a gate insulating film in contact with the active layer; and
      a gate electrode overlapping with the channel forming region interposing the gate insulating film therebetween,
   wherein the base film has a plurality of rectangular shape or stripe shape projective portions only in the driver circuit and the controller,
   wherein the active layer of the thin film transistor of each of the driver circuit and the controller exists between the plurality of projective portions such that a portion of the active layer overlaps with the projective portion, and
   wherein the active layer of the thin film transistor of each of the driver circuit and the controller is crystallized by laser light.

31. A semiconductor display device according to claim 30, wherein the controller comprises a CPU and a memory.

32. A semiconductor display device according to claim 30, wherein height of the plurality of projective portions is from 0.01 µm to 3 µm.

33. A semiconductor display device according to claim 30, wherein the height of the plurality of projective portions is from 0.01 µm to 1 µm.

34. A semiconductor display device according to claim 30, wherein the width between the plurality of projective portions is from 0.01 µm to 2 µm.

35. A semiconductor display device according to claim 30, wherein the laser light is output by using one type or a plurality of types selected from the group consisting of YAG lasers, YVO$_4$ lasers, YLF lasers, YAlO$_3$ lasers, glass lasers, ruby lasers, Alexandrite lasers, Ti:sapphire lasers, and Nd:YVO$_4$ lasers.

36. A semiconductor display device according to claim 30, wherein the laser light is continuous wave laser light.

37. A semiconductor display device according to claim 30, wherein the semiconductor display device is applied to an electronic apparatus selected from the group consisting of a digital still camera, a notebook personal computer, a mobile computer, a DVD player, a goggle type display, a video camera and a cellular phone.

38. A semiconductor display device comprising:
   a pixel portion, a driver circuit and a controller comprising thin film transistors, each of the thin film transistors comprising:
      a base film;
      an active layer having at least two impurity regions and a channel forming region between the two impurity regions, and over the base film;
      a gate insulating film in contact with the active layer; and
      a gate electrode overlapping with the channel forming region interposing the gate insulating film therebetween,
   wherein the base film has a plurality of rectangular shape or stripe shape projective portions only in the driver circuit and the controller,
   wherein the channel forming region is thinner than the two impurity regions in the active layer of the thin film transistor of each of the driver circuit and the controller, and
   wherein the active layer of the thin film transistor of each of the driver circuit and the controller exists between the plurality of projective portions such that a portion of the active layer overlaps with the projective portion,
   wherein the active layer of the thin film transistor of each of the driver circuit and the controller is crystallized by laser light.

39. A semiconductor display device according to claim 38, wherein the controller comprises a CPU and a memory.

40. A semiconductor display device according to claim 38, wherein the height of the plurality of projective portions is from 0.01 μm to 3 μm.

41. A semiconductor display device according to claim 38, wherein the height of the plurality of projective portions is from 0.01 μm to 1 μm.

42. A semiconductor display device according to claim 38, wherein the width between the plurality of projective portions is from 0.01 μm to 2 μm.

43. A semiconductor display device according to claim 38, wherein the laser light is output by using one type or a plurality of types selected from the group consisting of YAG lasers, $YVO_4$ lasers, YLF lasers, $YAlO_3$ lasers, glass lasers, ruby lasers, Alexandrite lasers, Ti:sapphire lasers, and $Nd:YVO_4$ lasers.

44. A semiconductor display device according to claim 38, wherein the laser light is continuous wave laser light.

45. A semiconductor display device according to claim 38, semiconductor display device is applied to an electronic apparatus selected from the group consisting of a digital still camera, a notebook personal computer, a mobile computer, a DVD player, a goggle type display, a video camera and a cellular phone.

* * * * *